United States Patent

Masumi et al.

Patent Number: 6,114,104
Date of Patent: Sep. 5, 2000

[54] IMAGE RECORDING MATERIAL, DIRECT POSITIVE SILVER HALIDE PHOTOGRAPHIC MATERIAL AND IMAGE FORMING METHOD

[75] Inventors: Satoshi Masumi; Shigeo Tanaka, both of Odawara, Japan

[73] Assignee: Konica Corporation, Japan

[21] Appl. No.: 09/389,175

[22] Filed: Sep. 2, 1999

[30] Foreign Application Priority Data

Sep. 8, 1998 [JP] Japan .................................. 10-253792

[51] Int. Cl.$^7$ ...................................................... G03C 1/20
[52] U.S. Cl. .......................... 430/547; 430/293; 430/378; 430/407; 430/596; 430/940
[58] Field of Search .................... 430/547, 293, 430/596, 940

[56] References Cited

U.S. PATENT DOCUMENTS 4,705,745  11/1987  Kitchin et al. .......................... 430/293
5,244,776   9/1993  Kawai ..................................... 430/940
5,541,040   7/1996  Okawauchi et al. .................... 430/547

FOREIGN PATENT DOCUMENTS 0398664  11/1990  European Pat. Off. .
0588649   3/1994  European Pat. Off. .
0672945   9/1995  European Pat. Off. .
2172118   7/1986  United Kingdom .

*Primary Examiner*—Hoa Van Le
*Attorney, Agent, or Firm*—Jordan B. Bierman; Bierman, Muserlian and Lucas

[57] ABSTRACT

A direct positive silver halide photographic light sensitive material is disclosed, having yellow, magenta and cyan image forming units, wherein at least one of the color image forming units contains at least two internal latent image forming silver halide emulsions which are different in a factor of contribution to image formation, a silver halide emulsion having a lower factor of contribution to image formation having a part common to sensitivity of a silver silver halide emulsion contained in one of the other two image forming units, and the photographic material is subjected to exposure, based on digitized image information.

10 Claims, 2 Drawing Sheets

of the invention can be accomplished

IMAGE RECORDING MATERIAL, DIRECT POSITIVE SILVER HALIDE PHOTOGRAPHIC MATERIAL AND IMAGE FORMING METHOD

FIELD OF THE INVENTION

The present invention relates to image recording materials, specifically, silver halide color photographic light sensitive material employing silver halide emulsions (hereinafter, also referred to as color photographic materials), and in particular to direct positive type silver halide color photographic materials suitable for forming color images used for proofing (color proofs) from image information obtained through color separation and halftone dot image conversion in the process of color plate-making and printing.

BACKGROUND OF THE INVENTION

Disclosed in JP-A 56-113139, 56-104335, 62-280746, 62-280747, 62-280748, 62-280749 and 62-280750 (herein, the term "JP-A" means an unexamined and published Japanese Patent Application) is a method for preparing, in the process of color plate-making and printing, a color proof from plural black-and-white halftone dot images obtained through color separation and halftone dot image conversion was disclosed a method for preparing a color proof by the use of a silver halide color photographic material.

Recently, there has been increasingly employed a plate-making method in which images are converted to digital signals, after which image editing is carried out with a computer without the use of the above-mentioned black-and-white halftone dot images formed on photographic film. Digitization of image information enables image processing, rapidly transmitting images without regard to distance and promptly editing images by varying image lay-out as well as color tone.

As a method for outputting the thus edited images in the form of a color proof is known a method of subjecting color paper to scanning exposure with laser beams. This method, however, has various problems in practical use such as the apparatus being expensive and the functional life of light sources being short.

To enhance quality of the color proof, it is necessary to enhance monochromatic color reproducibility and firmness of black color density. In printing materials, in general, color reproduction and firm black color density can be achieved using four color inks of yellow, magenta, cyan and black. In silver halide color photographic materials, on the other hand, color images are formed in yellow, magenta and cyan dye forming layers. In this regard, however, such dilemma is faced that increasing color densities to enhance firmness of black color images result in deteriorated monochromatic reproduction and decreasing color densities to enhance the monochromatic reproduction leads to deterioration in firmness of black color images. In cases where preparing color proofs using direct positive type silver halide photographic materials, the monochromatic density may be decreased through additional minor exposure, but problems were produced such that it was difficult to control a small amount of exposure using laser light source, resulting in uneven monochromatic densities.

SUMMARY OF THE INVENTION

Accordingly, it is an object of the present invention to provide a silver halide color photographic material and an image forming method, thereby enabling obtaining stable color images of high quality through scanning exposure.

The object of the present invention can be accomplished by the following constitution:

(1) a direct positive silver halide photographic material comprising a support having thereon a yellow image forming unit, a magenta image forming unit and a cyan image forming units, each of the image forming units containing at least an internal latent image-forming silver halide emulsion, wherein one or more of the image forming units contain at least an internal latent image-forming silver halide emulsion having a spectral sensitivity maximum in the wavelength region of from 700 to 850 nm, at least one of the image forming units containing at least two internal latent image forming silver halide emulsions 1 and 2, the emulsion 1 having a lower factor of contribution to image formation than the emulsion 2, and emulsion 1 having a spectral sensitivity with a part common to a spectral sensitivity of a silver halide emulsion contained in one of the other two image forming units; said photographic material further being subjected to exposure, based on digitized image information;

(2) an image forming method of a silver halide photographic material comprising:

subjecting the photographic material to exposure, based on digitized image information, wherein a semiconductor laser or a light emission diode is used as a light source, and the photographic material is a direct positive silver halide photographic material, as described in (1) above; and (3) a method for preparing color proofs comprising:

subjecting the photographic material to exposure, based on digitized image information, wherein a semiconductor laser or a light emission diode is used as a light source and the photographic material is a direct positive silver halide photographic material, as described in (1) above.

DETAILED DESCRIPTION OF THE INVENTION

Figure 1:
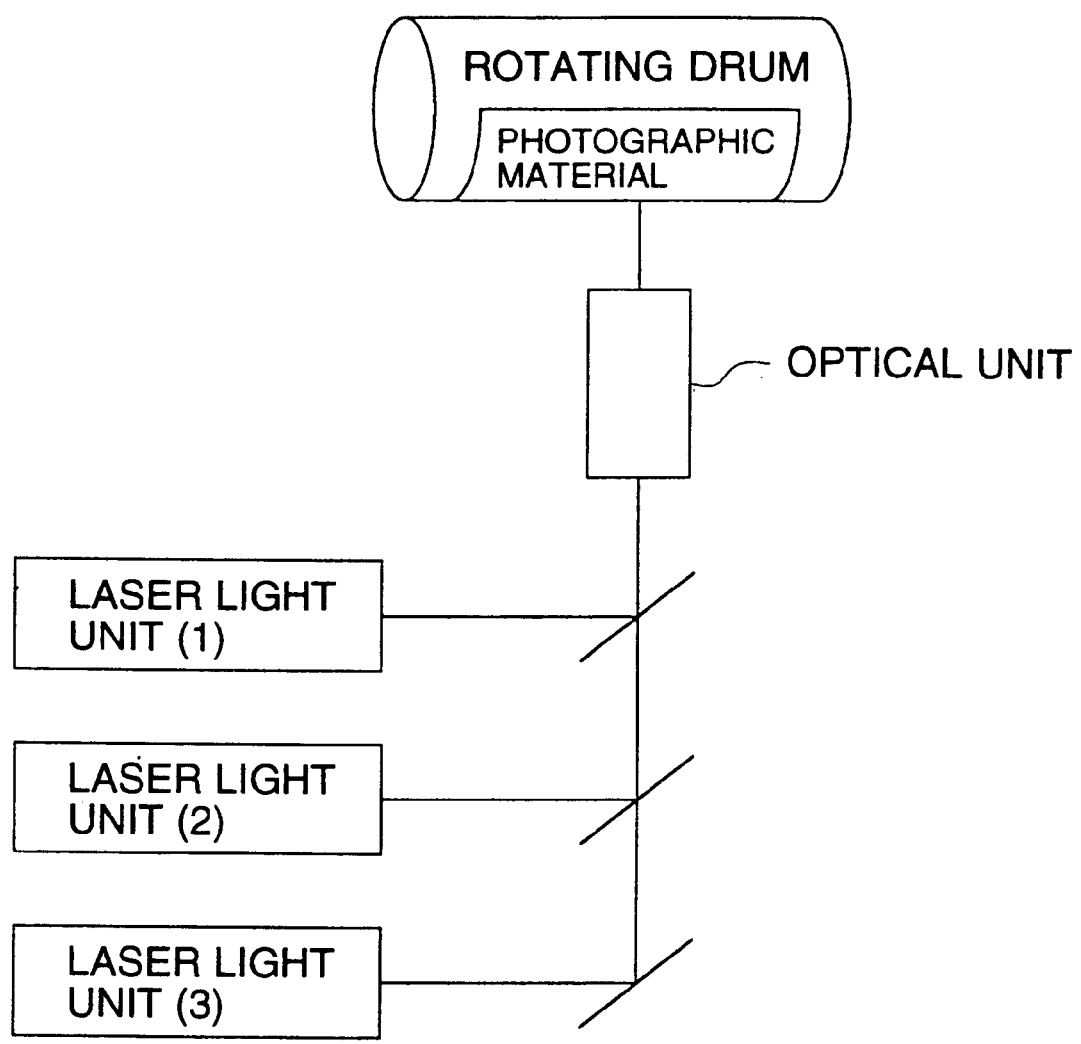
FIG. 1 is a conceptual illustration of an exposure apparatus to which one embodiment of the exposure apparatus used in the invention is applicable.

In the invention, image recording materials are silver halide photographic light sensitive materials having a silver halide emulsion as a photosensitive element, which is preferably a direct positive silver halide emulsion.

The contribution factor to image formation means a factor (or proportion) of the contribution to achieve the maximum density when the maximum density is formed in the image forming unit. For example, suppose two kinds of direct positive silver halide emulsions are contained in the image forming unit, totally giving a maximum density (3). Further, supposing each emulsion is individually contained in the image forming unit and singly developed, the emulsion (2) giving a higher maximum density (2) is referred to as an emulsion having a higher contribution factor, or the other emulsion (1) giving a lower maximum density (1) is referred to as an emulsion having a lower contribution factor. In this case, the total maximum density (3) is to be equal to the sum of the individual maximum density (1) and (2). Furthermore, the maximum density (1) is preferably 30% or less of the total maximum density (3). Thus, the contribution of the emulsion having a lower contribution factor is preferably 30% or less of the total maximum density. The contributing factor can be controlled by adjusting the proportion of each emulsion. Thus, the mole percentage of the emulsion having a lower contribution factor is preferably 25 mol % or less, and more preferably 2 to 25 mol %, based on silver.

In cases where plural image forming units each are comprised of photosensitive elements different in the contribution factor, the photosensitive elements having a higher contribution factor in the yellow, magenta or cyan image forming units are different from each other, but the photosensitive element having lower contribution factor in each of the image forming units may be the same or different from each other. The photosensitive element having a lower contribution factor may be contained in any one of the image forming units or in any two or of the image forming units. The photosensitive element having a lower contribution factor is allowed to be contained in plural image forming units, the photosensitive element having lower contribution factor may have sensitivity in the photosensitivity region of the photosensitive element having higher contribution factor which is contained in the same image forming unit, or may have sensitivity in the region other than the photosensitive region of the photosensitive element having a higher contribution factor which is contained in any one of the image forming units. The expression "have sensitivity in the region other than the photosensitive region of photosensitive element having higher contribution factor" means having a photosensitivity region in which sensitivity difference between the photosensitive elements having higher contribution factor and the photosensitive element having lower contribution factor is 500 times or more. It is preferred to allow the element having lower contribution factor and having sensitivity in the photosensitivity region of the photosensitive element having higher contribution factor which is contained in the same image forming unit.

In preferred embodiments of the invention, in which photosensitive elements different in the contribution factor are contained in the image forming unit, the precision of controlling exposure can be enhanced by using a relatively low sensitive element as the photosensitive element having a lower contribution factor, thereby enabling to obtain sharp black image and color images of color proofs. In the art regarding color negative papers, there has been known a technique in which plural emulsions different in sensitivity are blended to expand latitude, and a technique for reproducing details with subtle contrast by causing color mixing in the high density portion. However, the present invention is distinct from these techniques.

In the invention, as afore-mentioned, images (or image information) are converted to digital signals, after which image editing is carried out with a computer without the use of the black-and-white halftone dot images formed on photographic films. Thus, the expression "being subjected to exposure, based on digitized image information" means that exposure is directly conducted, based on image information thus-edited with a computer, not through halftone dot image information formed on the film.

Light sources usable in the invention include tungsten lamps and laser light sources. It is preferred to perform exposure using a laser light source unit. Specifically, it is preferred to a semiconductor laser or a light emission diode in terms of light source stability and low cost. A variety of lasers known in the art can be employed to expose photographic materials. A gas laser can exhibit high output, but needs a large-scale and expensive device and also needs a modulator. On the contrary, a semiconductor laser is compact and low-priced, having long life-time. Semiconductor lasers include one having oscillating wavelengths in the range of a visible region to an infrared region. Exemplary examples of gas lasers include helium-cadmium laser (441.6 nm), argon ion laser (514.4 nm) and helium-neon laser (632.8 nm). Examples of the semiconductor laser include AlGaInAs (650 nm) and GaAlAs (760 to 850 nm). A light source of 532 nm can also be obtained by a combination of YAG laser and SHG.

The exposure apparatus used in the invention comprises at least three laser light source units, which are different in wavelength from each other. Herein, the laser light source unit is a unit constituting a laser light source outputting a laser light having a specified wavelength. In one case, a laser oscillator corresponding to the laser light source having a wavelength may be single. In another case, plural laser oscillators may concurrently function as a light source at a specified wavelength, and also as an imagewise-exposing light source. The three laser light source units used in the invention are different in wavelength from each other and the oscillation wavelength is at least 30 $\mu$m, and more preferably at least 50 nm different than each of the others.

Photographic materials may be exposed to a single laser beam spot, or plural laser beam spots of the same wavelength may be simultaneously irradiated onto the photographic material. It is preferred to employ plural laser beam spots in terms of enhanced productivity. The plural laser beam spots can be formed by using plural laser oscillators of the same wavelength or by dividing a beam from a single laser light source into plural beams. The expression "plural" means two or more, and specifically 2 to 500 beams. Two to 30 beams are preferred in practical use, such that the number of the beams is optionally selected in terms of optimal productivity.

The diameter of the laser beam is preferably not more than 25 $\mu$m, specifically, the diameter of the beam having the longest wavelength is preferably not more than 25 $\mu$m. Further, the diameter of an infrared laser beam used in the invention is preferably not more than 25 $\mu$m, and more preferably 6 to 22 $\mu$m. A beam diameter of less than 6 $\mu$m is favorable in terms of image quality, but it can make adjustment difficult or can lower the processing speed. When scanning-exposure is run on a high speed-rotating drum, a beam diameter of more than 25 $\mu$m, specifically of the infrared laser, reduces uniformity and deteriorates image sharpness. Limiting the beam diameter to the range described above enables high definition and uniform images. Nothing is described in JP-A 4-330437 with respect to such problems on a rotating drum. According to the invention, writing-in of high definition, uniform images with an infrared laser at high speed is achieved at high productivity.

In this invention, the expression "having the same wavelength" means that the difference in wavelength between the laser light sources is within 10 nm. Although the wavelength of the laser light varies with environmental factors such as temperature and operating conditions, when measured under the same environmental conditions, the wavelength difference is to be not more than 10 nm.

There are known a method of exposing the photographic material by allowing laser light to be reflected onto a rotating polygon mirror and a method of exposing the photographic material by allowing it to be wound around a rotating drum.

In the invention, the latter is preferred in terms of exposure evenness, halftone dot reproducibility and dimensional stability.

The diameter of the rotating drum can be optionally set up to meet the size of the photographic material. The rotation speed of the drum can also be optionally set up and suitably selected taking account of the laser beam diameter, the energy intensity of laser light, the laser light writing-in pattern, the sensitivity of the photographic material, and so on. Scanning-exposure at a higher rotation speed is preferable in terms of productivity. Concretely, 200 to 300 rotations per minute is preferred. The photographic material can be fixed onto the drum by any common mechanical means. Alternatively, provided on the drum surface can be a large number of fine holes used for suction in accordance with the photographic material size and the photographic material is brought into close contact with the drum. To prevent trouble such as uneven images, the photographic material needs to be fixed so as to be brought into contact with the drum as closely as possible.

The exposure apparatus used in the invention is favorably used in exposure for large format prints and color proofs. In one preferred embodiment of the invention, a silver halide photographic material is wound in a roll form and contained in a room light-proof cartridge, thereby enabling handling under ambient light. This cartridge is loaded in the exposure apparatus, in which the photographic material is pulled out from the cartridge, cut to the desired length, wound around a rotating drum and imagewise exposed to laser light by the use of a laser exposure apparatus with rotating the drum and then the photographic material is further subjected to processing to obtain color images. In this case, the exposure apparatus has a mechanism for reading information provided to the roomlight cartridge, and automatically identifying the kind of the photographic material, setting exposure conditions, and/or setting processing conditions.

There have been proposed various roomlight cartridges and any one of known roomlight cartridges are usable. Included in the roomlight cartridge used in the invention is a so-called easy-loading type photographic material, in which the photographic material is shielded from ambient light by covering the periphery of the photographic material roll using a flange with a light-shielding leader and thereby the photographic material can be handled under room light, so that no darkroom is needed by removing the leader after loading in the exposure apparatus and the photographic material roll can easily be loaded into the apparatus. In this case, readable information can be provided to the leader or the flange.

Silver halide light sensitive photographic material used in the invention comprise at least yellow, magenta and cyan image forming units. Photosensitive elements having a higher contribution factor and contained in the image forming units, are different in wavelength of the spectral sensitivity maximum, in which at least one of the photosensitive elements preferably has a spectral sensitivity maximum within the range longer by 2 to 10 nm than the laser-exposing wavelength. In cases when the spectral sensitivity maximum is in the range of less than 2 nm longer than the laser-exposing wavelength, variation of laser oscillation wavelength results in increased variation of sensitivity, producing the problem of image stability being reduced. On the other hand, in cases when the spectral sensitivity maximum is in the range of more than 10 nm longer than the laser-exposing wavelength, there is produced the problem of the sensitivity being reduced. The spectral sensitivity maximum can be determined by any conventional method such as wedge spectrograph or sensitometry with a monochromatic light. In cases where a laser light source unit is comprised of plural oscillators, the wavelength of the laser light source unit is to be an average value of oscillation wavelengths.

A raw sample (i.e., unexposed and not processed sample) of the photographic material used in the invention preferably has a reflection density of not less than 0.8, and more preferably not less than 1.0, which can be measured at the wavelength of the laser exposure. The reflection density of the raw photographic material sample can be measured by the method known in the art. For example, spectral reflection density values measured by using Color Analyzer 607 (available from Hitachi Seisakusho) can be used. To make the reflection density prior to processing 0.8 or more, it is preferable to incorporate a water soluble dyestuff having an absorption within the spectral sensitivity region of the silver halide emulsion layer described above and/or to provide antihalation in the lowest layer or another layer. It is also preferred to incorporate a dyestuff in the form of a solid particle dispersion to prevent the dye from diffusion in the photographic material.

Examples of the water soluble dyestuff usable in the invention include those of oxonol, cyanine, merocyanine, azo, anthraquinone, and allylidene. Of these, an oxonol dyestuff and merocyanine dyestuff are preferred in terms of high degradability on processing and having no sensitizing ability to silver halide. The oxonol dyestuff is described in U.S. Pat. No. 4,187,225; and JP-A 48-42826, 49-5125, 49-99620, 50-91627, 51-77327, 55-120660, 58-24139, 58-143342, 59-38742, 59-111640, 59-111641, 59-168438, 60-218641, 62-31916, 62-66275, 62-66276, 62-185755, 62-273527 and 63-139949. The merocyanine dyestuff is described in JP-A 50-145124, 58-120245, 63-34537, 63-34538, 63-34539, and 63-58437. Exemplary examples of the oxonol dyestuff and merocyanine dyestuff include water soluble yellow dyestuffs AIY-1 to AIY-14, water soluble magenta dyestuffs AIM-1 to AIM-14 and water soluble cyan dyestuffs AIC-1 to AIC-14, as described in Japanese Patent Application No. 7-150291. Exemplary examples of water soluble dyestuffs other than the oxonol dyestuff and merocyanine dyestuff include water soluble yellow dyestuffs AIY-15 to AIY-18, water soluble magenta dyestuffs AIM-15 to AIM-18 and water soluble cyan dyestuffs AIC-15 to AIC-18, as described in Japanese Patent Application No. 7-150291. Furthermore, the water soluble dyestuff usable in the invention include dyestuffs A-1 to A-43 described in JP-A 4-330437. The water soluble dyestuff is incorporated in an amount giving 1.0 or more of the reflection density, which is measured at the wavelength of the spectral sensitivity maximum of the emulsion included in the unprocessed photographic material. The water soluble dyestuff can be incorporated singly or in combinations thereof.

The antihalation layer can be provided in the lowest layer or any other layer. The antihalation layer contains a light-absorbing compound. The light-absorbing compound includes a variety of light-absorbing organic compounds and inorganic compounds. Suitable inorganic compounds include colloidal silver and colloidal manganese, of which colloidal silver is specifically preferred. These colloid-formed metals are superior in decolorizability and advantageously employed in the color photographic material according to the invention. The colloidal silver, e.g., black colloidal silver can be obtained by a process in which silver nitrate is reduced, in gelatin, in the presence of a reducing agent such as hydroquinone, phenidone, ascorbic acid, pyrogallol or dextrin, while being maintained at specific alkalinity, followed by being neutralized, cooled, set and subjected to noodle washing to remove the reducing agent and unnecessary soluble salts. When reduced in alkalinity in the presence of an azaindene compound or a mercapto compound to prepare colloidal silver particles, a colloidal silver dispersion comprised of homogeneous particles can be obtained. The coverage of the colloidal silver can optionally be selected so as to give 1.0 or more of the reflection density measured at 730 nm of the unprocessed photographic material. In cases where is used in combination with other water soluble dyestuff(s), the reflection density of the unprocessed photographic material is preferably to be 1.0 or more.

The color photographic material according to the invention can contain a dyestuff having at least one of a carboxy group, sufonamido group and sulfamoyl group in the form of a solid particle dispersion, in a silver halide emulsion layer and/or other hydrophilic colloid layer. These dyestuffs are those represented by the following formulas [1] to [8]:

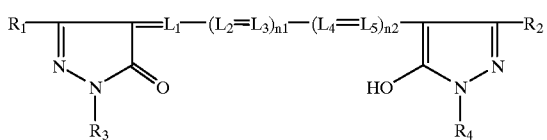

formula [1]

wherein
$R_1$ and $R_2$ are each a hydrogen atom, alkyl, alkenyl, aryl, heterocyclic group, —COOR5, —COR$_5$, —SO$_2$R$_5$, —SOR$_5$, —SO$_2$N(R$_5$)R$_6$, —CON(R$_5$)R$_6$, —N(R$_5$)R6, —N(R$_5$)SO$_2$R$_6$, —N(R$_5$)COR$_6$, —N(R$_5$)CON(R$_6$)R$_7$, —N(R$_5$)CSN(R$_6$)R$_7$, —OR$_5$, —SR$_5$ or cyano;
$R_3$ and $R_4$ each are a hydrogen atom, alkyl, alkenyl, cycloalkyl, aryl or a heterocyclic group;
$R_5$, $R_6$ and $R_7$ each are a hydrogen atom, alkyl, alkenyl, cycloalkyl, aryl or a heterocyclic group;
$L_1$ to $L_5$ each are a methine chain;
$n_1$ is 0 or 1; and
$n_2$ is an integer of 0 to 2;

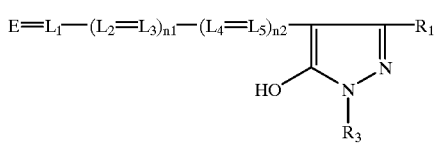

formula [2]

wherein $R_1$, $R_3$, $L_1$ to $L_5$, $n_1$ and $n_2$ are the same as $R_1$, $R_3$, $L_1$ to $L_5$, $n_1$ and $n_2$ defined in formula [1], and E is an acidic nucleus necessary to form an oxonol dye;

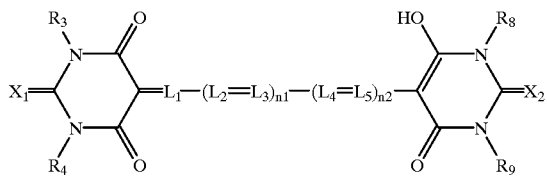

formula [3]

wherein $R_3$, $R_4$, $L_1$ to $L_5$, $n_1$ and $n_2$ are the same as $R_3$, $R_4$, $L_1$ to $L_5$, $n_1$ and $n_2$ defined in formula [1], $R_8$ and $R_9$ each are the same $R_3$ and $R_4$, respectively, and $X_1$ and $X_2$ each are a oxygen atom or sulfur atom;

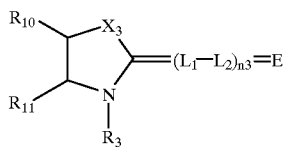

formula [4]

wherein $R_3$, $L_1$ and $L_2$ are the same as $R_3$, $L_1$ and $L_2$ defined in formula [1], E is the same as defined in formula [2], $R_{10}$ and $R_{11}$ each are a hydrogen atom, alkyl, alkenyl, aryl, a heterocyclic group, nitro, cyano, a halogen atom, —OR$_5$, —SR$_5$, —N(R$_5$)R$_6$, —N(R$_5$)SO$_2$R$_6$, —N(R$_5$)COR$_6$, —COR$_5$ or —COOR$_5$, provided that $R_{10}$ and $R_{11}$ may combined with each other to form a ring, X3 is an oxygen atom, sulfur atom, selenium atom, —(R$_{12}$)C(R$_{13}$)— or —N(R$_3$)—, $R_3$, $R_5$ and $R_6$ are the same $R_3$, $R_5$ and $R_6$ defined in formula [1], $R_{12}$ and $R_{13}$ each are a hydrogen atom or alkyl, and $n_3$ is an integer of 1 to 3,

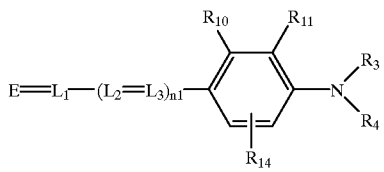

formula [5]

wherein $R_3$, $R_4$, $L_1$, $L_2$, $L_3$ and $n_1$ are the same as $R_3$, $R_4$, $L_1$, $L_2$, $L_3$ and $n_1$ defined in formula [1], E is the same as defined in formula [2], $R_{10}$ and $R_{11}$, each are the same $R_{10}$ and $R_{11}$ defined in formula [4], and $R_{14}$ is the same as defined in $R_{10}$,

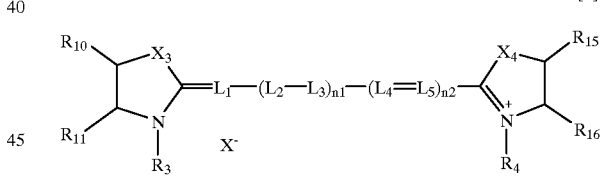

formula [6]

whererin $R_3$, $R_4$, $L_1$ to $L_5$, $n_1$ and $n_2$ are the same as $R_3$, $R_4$, $L_1$ to $L_5$, $n_1$ and $n_2$ defined in formula [1], $R_{10}$, $R_{11}$, $X_3$ each are the same as $R_{10}$, $R_{11}$, $X_3$ defined in formula [4], $X_4$ is the same as defined in $X_3$, and $R_{15}$ and $R_{16}$ are the same as defined in $R_{10}$, and X$^-$ is a group having an anion (or anionic group), provided that $R_{10}$ and $R_{11}$, or $R_{15}$ and $R_{16}$ may combine with each other to form a ring;

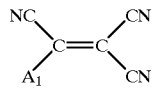

formula [7]

wherein $A_1$ is a pyrrol nucleus, imidazole nucleus, pyrazole nucleus, phenol nucleus, naphthol nucleus or condensed heterocyclic ring;

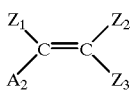

formula [8]

wherein $Z_1$, $Z_2$ and $Z_3$ each are an electron-withdrawing group and $A_2$ is aryl or a heterocyclic group.

Examples of the dyestuff having at least one of a carboxy group, sufonamido group and sulfamoyl group include exemplified dyestuffs 1-1 to 8-7 described in Japanese Patent Application No. 7-150291. The dyestuff having at least one of a carboxy group, sufonamido group and sulfamoyl group is substantially insoluble in water (i.e., water at a pH of 7 or less), having a hydrophilic group which is capable of being dissociated at a pH of 9 or more. The dyestuff, which is made to be present in gelatin or a polymeric binder, in the form of a fine solid particle dispersion (i.e., solid particles having microscopic dimension and preferably an average particle size of 10 μm or less, and more preferably 1 μm or less) obtained by means of a technique of pulverizing with a ball mill or a sand mill or a technique of dissolving in an organic solvent and dispersing in a gelatin solution, can be incorporated into any one of photographic component layers including a light sensitive emulsion layer and a hydrophilic colloid layer. The fine solid particle dispersion of the dyestuff having at least one of a carboxy group, sufonamido group and sulfamoyl group can be stably present, in a water-insoluble form, in the color photographic material, and almost disappears by being subjected, after exposure, to processing with a color developing solution (preferably at a pH of 9 or more). The dyestuff having at least one of a carboxy group, sufonamido group and sulfamoyl group may be used in combination thereof or in combination with a water soluble dyestuff or colloidal silver. The dyestuff having at least one of a carboxy group, sufonamido group and sulfamoyl group can be incorporated by appropriately selecting the content so as to give 0.8 or more of a reflection density measured at a wavelength of the spectral sensitivity maximum of at least one of the emulsions included in the unprocessed color photographic material according to the invention. The amount to be incorporated is generally in the range of 0.001 to 0.5 $g/m^2$.

A support used in the invention is covered with a resin comprised of, as a main component, a polyolefin resin on both sides of a paper base. When the surface roughness of the support is continuously measured and measured signals are analyzed with respect to frequency, an integrated value of power spectrum within the frequency range of 1 to 12.5 mm (PY value) is preferably not more than 2.9 μm, more preferably not more than 1.8 μm, and still more preferably not more than 1.15 μm. The use of a support having a PY value of more than 2.9 μm result in non-uniform images at an increased rotating speed of the drum, leading to deteriorated dot reproduction. To determine the PY value, the surface roughness of the support is continuously measured using a film thickness continuously-measuring instrument (e.g., available from Anritsu Electric Co., ltd.) and measured signals are analyzed with respect to frequency using a frequency analyzer (e.g., VC-2403, available from Hitachi Electronics Co, Ltd.).

The raw material of the base paper used for the present invention can be selected from those ordinarily used for photographic paper. For example, natural pulp, synthetic pulp, mixtures of natural pulp and synthetic pulp and various raw materials for papering are cited. Ordinarily, conifer pulp, hard-wood pulp and natural pulp wherein a mixed pulp of a conifer pulp and a hard-wood pulp are the main components are widely be used. In addition, in the above-described support, additives ordinarily used in papers such as sizing agents, fixing agents, heavy duty strengthening agents, fillers, antistatic agents and dyes may be added. In addition, surface sizing agents, surface tension agents and anti-static agents may be coated appropriately on the surfaces.

For the support described above, those having a flat surface and ordinarily a weight of 50 through 300 $g/m^2$, are preferably used. A resin, laminated on both surfaces may be selected from a single polymer such as ethylene, polyethylene terephthalate and α-olefines such as polypropylene, a copolymer of at least two kinds of the above-mentioned olefines and mixtures of at least two kinds of polymers. Specifically preferable polyolefin resins are a low density polyethylene, high density polyethylene or an admixture of them. The molecular weight of the polyolefin resin is not specifically limited. However, normally, those within a range of 20,000 through 200,000 are preferable. A polyolefin resin-laminated layer on one side of a photographic support used in the present invention, where a photographic emulsion is coated, is preferably 25 through 50 μm and more preferably 25 through 35 μm.

With regard to polyolefin used for laminating the rear side (the side opposite to the surface wherein emulsion layers are provided) of the support, ordinarily, a mixture of a low density polyethylene and a high density polyethylene is fused and then laminated. This layer is generally subjected to a matting treatment.

When laminating the surface and a back side of the support, in order to enhance flatness of an exposed photographic paper in a normal environment, a means to increase the density of the resin layer on the surface slightly more than the back side and a means to increase the amount of lamination of the back side to be greater than the surface, are ordinarily adopted.

In addition, for ordinary lamination of the surface and back of the support, a polyolefin resin component is formed on the support by means of a fusion extruding coating method. It addition, it is preferable that the surface of the support and, if necessary, both sides of the support are subjected to corona discharge processing as well as flame processing. In addition, it is also preferable to provide a sub-coating layer for improving adhesion property with the photographic emulsion on the surface of the surface lamination layer or to provide a backing layer for improving printing and writing property and anti-static property on the lamination layer on the back side.

In a polyolefine resin used for laminating the surface (on which emulsion layers are provided) of the support used in the present invention, preferably 13 through 20 weight % and more preferably 15 through 20 weight % of white pigment is dispersed and mixed. As a white pigment, an inorganic and/or an organic white pigment can be used, including sulfate of alkaline earth metals such as barium sulfate, carbonate of alkaline earth metals such as calcium carbonate, silica such as fine powdery silicic acid and synthetic silicate, calcium silicate, alumina, alumina hydrate, titanium oxide, zinc oxide, talc and clay.

Of these, preferable are barium sulfate, calcium carbonate and titanium oxide. More preferable are barium sulfate and titanium oxide. The titanium oxide may either be a rutile type or an anatase type. In addition, those laminated with a metal oxide such as alumina oxide hydrate and ferrite oxide hydrate may also be used. In addition, it is preferable to use an anti-oxidation agent, a colored pigment for improving whiteness and a fluorescent brightening agent. When laminating the surface and a back side of the support, in order to enhance flatness of an exposed photographic paper in a normal environment, a means to increase the density of the resin layer on the surface slightly more than the back side and a means to increase the amount of lamination of the back side to be greater than the surface, are ordinarily adopted.

In addition, it is preferable to use an anti-oxidation agent, a colored pigment for improving whiteness and a fluorescent brightening agent.

It is preferable that sharpness is improved by coating a hydrophilic colloidal layer containing a white pigment on the support. As a white pigment, the same white pigment as the foregoing can be used. Titanium oxide is preferable. In a hydrophilic colloidal layer containing a white pigment, it is preferable to add a hollow fine particle polymer and a high boiling organic solvent since sharpness and/or curling resistance can be improved.

The surface of the reflective support used in the present invention may be flat or may have some appropriate surface coarseness. However, it is preferable to select a reflective support having glossiness close to a printed material. For example, it is preferable to use a white support whose average surface roughness stipulated in JIS B 0601-1976 is 0.30 through 3.0 μm.

In the present invention, surface roughness on an image forming surface is preferably 0.30 through 3.0 μm. For this purpose, a matting agent may be added in a structural layer on the image forming surface side. The matting agent may be added in the silver halide emulsion layer, the protective layer, the intermediate layer and the subbing layer. It may be added to plural layers, and preferably, to the outermost light-sensitive layer.

It is preferable that the surface on the image forming layer side of the photographic material of the present invention has glossiness close to a printed material. For example, the degree of glossiness GS (60°) measured by a method stipulated in JIS-Z8741 is preferably 5 through 60.

In a preferable embodiment of the present invention, it is preferable to form a protective layer on the outermost surface of the photographic material and to add matting agents into the protective layer. Examples of the matting agents usable in the invention include crystalline or non-crystalline silica, titanium dioxide, magnesium sulfate, calcium carbonate, barium sulfate, strontium barium sulfate, alumina magnesium silicate, silver halide, silicon dioxide, acrylic acid/methyl acrylate copolymer, acrylic acid/ethyl methacrylate copolymer, itaconic acid/styrene copolymer, maleic acid/styrene copolymer, maleic acid/methyl methacrylate copolymer, acrylic acid/phenylacrylate copolymer, polymethyl methacrylate, acrylic acid/methacrylic acid/ ethyl methacrylate copolymer polystyrene, starch, and cellulose acetate propionate. In addition, compounds described in U.S. Pat. Nos. 1,221,980 and 2,992,101 are also cited. These can be used singly or in combination of two or more kinds thereof. Colloidal silica can also be used in combination with a matting agent.

The average particle size of the matting agent is preferably 1 to 10 μm, and more preferably 3 to 10 μm. The average particle size refers to an average value of particle diameters in the case of spherical particles, or an average value of diameters of a circle equivalent to the projected area in the case of a cubic form or a form other than the spherical form. The average particle size (rm) is defined as below. Applicable as an exemplary measuring method is the method described in JP-A 59-29243.

$$rm = \Sigma ni \cdot ri / \Sigma ni$$

where ri is a particle diameter and ni is the number of particles having a diameter of ri.

The matting agent used in the invention is incorporated in a layer on the side opposite the light sensitive emulsion layer, in the form a dispersion. The matting agent is dispersed in a hydrophilic binder optionally containing a nonionic, cationic or anionic surfactant using a high-speed mixer, homogenizer, ultrasonic homogenizer or ball mill and then is coated by an appropriate method. The coating weight of the matting agent is preferably 50 to 500 mg/m$^2$, and more preferably 70 to 300 mg/m$^2$. The content of the matting agent is preferably 3 to 50% by weight, and more preferably 5 to 20% by weight, based on a hydrophilic binder. In addition, as a reflective support used in the present invention, synthetic resin film supports such as polypropylene laminated with polyolefin on the surface can also be used.

There is no limit to the thickness of the reflective support used in the present invention, 80 through 160 μm being preferable, and 90 through 130 μm being more preferable. The weight of the reflective support is preferably not more than 130 g/m$^2$, and more preferably 70 to 120 g/m$^2$.

A support used in the photographic material preferably has a Taber stiffness of 0.8 to 4.0. The Taber stiffness can be measured by a rigidity measuring apparatus, such as model 150B Taber Stiffness Tester (available from TABER INSTRUMENT-A TELEDYNE COMPANY). The support is, in general, different in rigidity between in the longitudinal and width directions, and at least one of them is preferably within the stated range.

The diameter of an infrared laser beam used in the invention is preferably not more than 25 μm, and more preferably 6 to 22 μm. When scanning-exposure is run on a high speed-rotating drum, a beam diameter of more than 25 μm, specifically of the infrared laser, reduces uniformity and deteriorates image sharpness. Limiting the beam diameter to the range described above enables high definition and uniform images. Nothing is described in JP-A 4-330437 with respect to such problems on a rotating drum. According to the invention, writing-in of high definition, uniform images with an infrared laser at high speed is achieved at high productivity.

An infrared-sensitive silver halide emulsion layer used in the invention a spectral sensitivity maximum at the wavelength of 700 nm or more. Preferably used as a means for infrared spectral sensitization is sensitization with an infrared sensitizing dye. The infrared sensitizing dye usable in the invention is not specifically limited, but tricarbocyanine dyes and/or 4-quinoline nucleus-containing dicarbocyanine dyes are preferably used, and the tricarbocyanine dyes are specifically preferred. Of the tricarbocyanine dyes, a dye represented by the following formula [Ia] or [Ib] is preferably used:

formula [Ia]

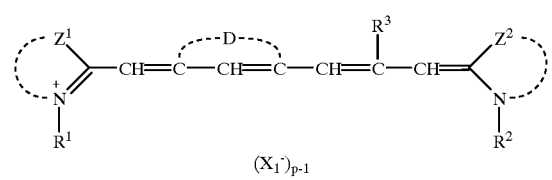

formula [Ib]

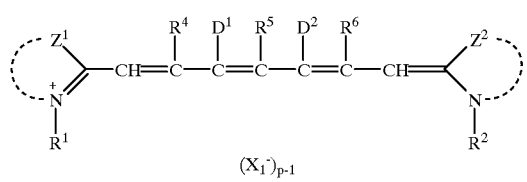

$(X_1^-)_{p-1}$

In the formulas, $R^1$ and $R^2$, each of which may be the same or different from the other, are alkyl (preferably having 1 to 18 carbon atoms, such as methyl, ethyl, propyl, butyl, pentyl, hexyl), substituted alkyl having not more than carbon atom in the alkyl portion and substituted by a substituent, including carboxy, sulfo, cyano, halogen atom such as fluorine, chlorine or bromine, hydroxy, alkoxycarbonyl group having 8 or less carbon atoms, such as methoxycarbonyl, ethoxycarbonyl or benzyloxycarbonyl), alkoxy (having 7 or less carbon atoms, such as methoxy, ethoxy, propoxy, butoxy, or benzyloxy), aryloxy (such as phenoxy or p-tolyloxy), acyloxy (having 3 or less carbon atoms, such as acetyloxy or propionyloxy), acyl (having 8 or less carbon atoms, such as acetyl, propionyl, benzoyl or methyl), carbamoyl (such as carbamoyl, N,N-dimethylcarbamoyl, morpholinocarbamoyl or piperidylcarbamoyl), sulfamoyl (such as sulfamoyl, N,N-dimethylsulfamoyl or morpholinosulfonyl), and aryl (such as phenyl, p-hydroxyphenyl, p-carboxyphenyl, p-sulfophenyl or α-naphthyl). $R^3$ is a hydrogen atom, methyl, methoxy or ethoxy. $R^4$ and $R^6$ each are a hydrogen atom, lower alkyl (such as methyl, ethyl, or propyl), lower alkoxy (such as methoxy, ethoxy, propoxy or butoxy), phenyl or benzyl. $R^5$ is a hydrogen atom, lower alkyl (such as methyl, ethyl or propyl), lower alkoxy (such as methoxy, ethoxy, propoxy or butoxy), phenyl, benzyl or —N(W$^1$) (W$^2$), in which $W^1$ and $W^2$ each are substituted or unsubstituted alkyl (having 1 to 18 carbon atoms and preferably 1 to 4 carbon atoms in the alkyl portion, such as methyl, ethyl, propyl, butyl, benzyl, or phenethyl) or aryl (such as phenyl, naphthyl, tolyl or p-chlorophenyl), provided that $W^1$ and $W^2$ may combine with each other to form a 5- or 6-membered heterocyclic ring.

D represents an atomic group necessary to complete a divalent alkylene bond such as ethylene or triethylene. This alkylene bond may be substituted by one, two or more appropriate group such as alkyl having 1 to 4 carbon atoms (such as methyl, ethyl, propyl, i-propyl or butyl), halogen atom (such as chlorine or bromine) or alkoxy (having 1 to 4 carbon atoms, such as methoxy, ethoxy, propoxy, i-propoxy or butoxy).

$D^1$ and $D^2$ each are a hydrogen atom, provided that $D^1$ and $D^2$ may combine with each other to form a divalent alkylene bond as defined above. $Z^1$ and $Z^2$ each represent a non-metallic atom group necessary to form a 5- or 6-membered nitrogen-containing heterocyclic ring, such as a thiazole nucleus {e.g., benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 6-bromobenzothiazole, 5-iodobenzothiazole, 5-phenylbenzothiazole, 5-methoxybenzothiazole, 6-methoxybenzothiazole, 5-ethoxybenzothiazole, 5-carboxybenzothiazole, 5-ethoxycarbonylbenzothiazole, 5-phenethylbenzothiazole, 5-fluorobenzothiazole, 5-trifluorobenzothiazole, 5,6-dimethylbenzothiazole, 5-hydroxy-6-methylbenzothiazole, tetrahydrobenzothiazole, 4-phenylbenzothiazole, naphtho[2,1-d]thiazole, naphtho[1,2-d]thiazole, naphtho[2,3-d]thiazole, 5-methoxynaphtho[1,2-d]thiazole, 7-ethoxynaphtho[2,1-d]thiazole, 8-methoxynaphtho[2,1-d]thiazole, 5-methoxynaphtho[2,3-d]thiazole, etc.}; selenazole nucleus {e.g., benzoselenazole, 5-chlorobenzoselenazole, 5-methoxybenzoselenazole, 5-methylbenzoselenazole, 5-hydroxybenzoselenazole, naphtho[2,1-d]selenazole, naphtho[1,2-d]selenazole, etc.}; oxazole nucleus {e.g., benzoxazole, 5-chlorobenzoxazole, 5-methylbenzoxazole, 5-bromobenzoxazole, 5-fluorobenzoxazole, 5-phenylbenzoxazole, 5-methoxybenzoxazole, 5-trifluorobenzoxazole, 5-hydroxybenzoxazole, 5-carboxybenzoxazole, 6-methylbenzoxazole, 6-chlorobenzoxazole, 6-methoxybenzoxazole, 6-hydroxybenzoxazole, 4,6-dimethylbenzoxazole, 5-ethoxybenzoxazole, naphtho[2,1-d]oxazole, naphtho[1,2-d]oxazole, naphtho[2,3-d]oxazole, etc.}; quinoline nucleus {e.g., 2-quinoline, 3-methyl-2-quinoline, 5-ethyl-2-quinoline, 6-methyl-2-quinoline, 8-fluoro-2-quinoline, 6-methoxy-2-quinoline, 6-hydoxy-2-quinoline, 8-chloro-2-quinoline, 8-fluoro-2-quinoline, etc.}; 3,3-dialkylindolenine nucleus (e.g., 3,3-dimetylindolenine, 3,3-dietylindolenine, 3,3-dimetyl-5-cyanoindolenine, 3,3-dimetyl-5-methoxyindolenine, 3,3-dimetyl-5-methylindolenine, 3,3-dimetyl-5-chloroindolenine, etc.); imidazole nucleus {e.g., 1-methylbenzoimidazole, 1-ethylbenzoimidazole, 1-methyl-5-chlorobenzoimidazole, 1-ethyl-5-chlorobenzoimidazole, 1-methyl-5,6-dichlorobenzoimidazole, 1-ethyl-5,6-dichlorobenzoimidazole, 1-alkyl-5-methoxylbenzoimidazole, 1-methy-5-cyanolbenzoimidazole, 1-methyl-5-fluorobenzoimidazole, 1-ethyl-5-fluorobenzoimidazole, 1-phenyl-5,6-dichlorobenzoimidazol, 1-allyl-5,6-dichlorobenzoimidazole, 1-allyl-5-chlorobenzoimidazole, 1-phenylbenzoimidazole, 1-phenyl-5-chlorobenzoimidazole, 1-methyl-5-trifluorobenzoimidazole, 1-ethyl-5-trifluoromethylbenzoimidazole, 1-ethylnaphtho[1,2-d]imidazole, etc.}; pyridine nucleus (e.g., pyridine, 5-methyl-2-pyridine, 3-methyl-4-pyridine, etc.).

Of these nuclei, a thiazole nucleus and a oxazole nucleus are preferably used, and benzothiazole nucleus, naphthothiazole nucleus, benzoxazole nucleus and naphthooxazole nucleus are more preferably used. $X_1^-$ is an acidic anion and p is 1 or 2.

Among 4-quinoline nucleus containing dicarbocyanine dyes used in the invention, specifically preferred one is represented by the following formula [II]:

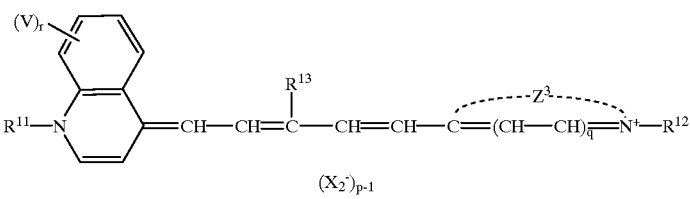

formula [II]

wherein
$R^{11}$ and $R^{12}$ each are the same as defined in $R^1$ and $R^2$;
$R^{13}$ is the same as defined in $R^4$, provided that $R^{13}$ is preferably a lower alkyl or benzyl;
V are a hydrogen atom, lower alkyl (e.g., methyl, ethyl, propyl), alkoxy (e.g., methoxy, ethoxy, butoxy), halogen atom (e.g., fluorine, chlorine) and substituted alkyl (e.g., trifluoromethyl carboxymethyl);
$Z^3$ is the same as defined in $Z^1$ and $Z^2$;
$X_2^-$ and p is the same as $X_1^-$ and p defined in formulas [Ia] and [Ib];
q and r each are 1 or 2.

Exemplary examples of the infrared sensitizing dyes include dyes I-1 to II-21 described in JP-A 2-40646 at pages (69-(9), compounds described in JP-A 4-330437 and compounds described in JP-A 8-101486.

The silver halide photographic material, which has been wound into a roll and contained in a roomlight handling cartridge, is preferably used. The roomlight handling cartridge has not only a light-shielding means so as to prevent the photographic material from exposure under roomlight but also a pulling portion (or tab) for pulling the photographic material from the cartridge. Accordingly, when handled under roomlight, the photographic material is not exposed to light.

The photographic material, which has been wound into a roll and contained in a roomlight handling cartridge, is preferably wound so that the emulsion side of the photographic material is arranged to be on the outer side of the roll.

Layer arrangement of the photographic material used in the invention is not specifically limited, but an emulsion layer having spectral sensitivity in the longest wavelength region is preferably closer to the support than other layers. Specifically in cases where the emulsion layer having spectral sensitivity in the longest wavelength region is an infrared sensitive layer, the infrared sensitive emulsion layer is preferably closer to the support than other emulsion layers.

As the silver halide emulsion used in the present invention there may be used a surface latent image-type silver halide emulsion that is imagewise exposed to form a latent image on a surface, and further processed to thereby form a negative image. There may also be suitably used a previously unfogged internal latent image-forming type silver halide emulsion which, after being imagewise exposed, is subjected to fogging treatment (nucleus-formation treatment) followed by surface development or which, after being imagewise exposed, is subjected to surface development while being subjected to fogging treatment to thereby obtain a direct positive image. The above-described internal latent image-forming silver halide grain-containing emulsion is an emulsion containing silver halide crystal grains each having a sensitivity speck mainly in the interior of the grains to form an internal latent image when exposed to light.

The above fogging treatment may be achieved by overall exposure of the emulsion to light, chemically fogged with a fogging agent, processed in a strong developing solution or subjected to heat treatment.

The overall exposure process is conducted by exposing a photographic material uniformly and overall after immersing the imagewise exposed photographic material into a developing solution or other aqueous solutions, or wetting therewith. Here, as a light source used, any light source that has a light-sensitive wavelength range of the photographic material may be used. In addition, a high intensity light such as a flash may be given for a short time, or a low intensity light may be used for a period of longer time. In addition, the time of the overall exposure can be varied widely depending of the kind of the photographic material, photographic processing conditions and the kind of light source used so that superior positive images can be obtained. It is still more preferable that the overall exposure is given in an amount within a given range, in combination with the photographic material. Ordinarily, when exposure amount is excessively given, an increase of the minimum density and desensitization result, which tends to deteriorate image quality. As a technology of the fogging agent usable in the present invention, the technology described in JP-A No. 6-95283, page 18, right column, line 39 through page 19, left column, line 41 is preferable.

The previously unfogged internal latent image-type silver halide emulsion usable in the present invention is an emulsion containing silver halide grains each forming a latent image mainly within the grain and having most of sensitivity specks in the interior, and comprised of silver bromide, silver chloride, silver chlorobromide, silver chloroiodide, silver iodobromide, or silver chloroiodobromide.

The above emulsion is most preferably one which when coated on a support to prepare a sample so that its silver coating weight is in the range of about 1 to 3.5 g/m², and when a portion of the prepared sample is subjected to light intensity scale exposure for specified periods of time ranging from 0.1 to 1.0 second and developed at 20° C. for 4 minutes in the following surface developing solution A, which contains substantially no silver halide solvent for developing the surface image of the grain, the maximum density of the thus processed piece is not more than ⅕ of the maximum density of the other part of the same sample that was obtained by being similarly exposed and developed at 20° C. for 4 minutes in the following internal developing solution B capable of developing the internal latent image.

| Surface developing solution A | |
|---|---|
| Metol | 2.5 g |
| L-ascorbic acid | 10.0 g |
| Sodium metaborate, tetrahydrate | 35.0 g |

-continued

| | |
|---|---|
| Potassium bromide | 1.0 g |
| Water to make | 1000 cc |
| (Internal developing solution B) | |
| Metol | 2.0 g |
| Anhydrous sodium sulfite | 90.0 g |
| Hydroquinone | 8.0 g |
| Sodium carbonate, monohydrate | 52.5 g |
| Potassium bromide | 5.0 g |
| Potassium iodide | 0.5 g |
| Water to make | 1000 cc |

The internal latent image-type silver halide emulsions suitably usable in the present invention include those prepared in various methods, such as the conversion-type silver halide emulsion described in U.S. Pat. No. 2,592,250; the silver halide emulsion comprising internal chemically sensitized silver halide grains described in U.S. Pat. Nos. 3,206,316, 3,317,322 and 3,367,778; the emulsion containing polyvalent metallic ion-occluded silver halide grains described in U.S. Pat. Nos. 3,271,157, 3,447,927; the silver halide emulsion comprising weakly chemically sensitized silver halide grains containing a dopant described in U.S. Pat. No. 3,761,276; the silver halide emulsion comprising grains having a multilayer structure described in JP-A Nos. 50-8524, 50-38525 and 53-2408; and the silver halide emulsion described in JP-A Nos. 52-156614 and 55-127549. The internal latent image-type silver halide grain usable in the present invention may be any of silver halides such as silver bromide, silver chloride, silver chlorobromide, silver chloroiodide, silver iodobromide or silver chloroiodobromide. Silver chloride containing grains are superior in the developability and are suitable for rapid processing.

The silver halide crystal grains used in the present invention may have any of several common forms such as a cubic form, an octahedral form, a tetradecahedral form comprised of (100) and (111) faces, a form having (110) faces, a spherical form or a tabular form. Preferred silver halide grains are those having an average grain diameter of 0.05 to 3 μm. The silver halide emulsion used in the present invention may be either a monodisperse emulsion comprised of grains which are homogeneous in the grain diameter and crystal habit, or a polydisperse emulsion comprised of grains which are inhomogeneous in the grain diameter and crystal habit. In the present invention, the monodisperse silver halide emulsion is one in which silver halide grains having a grain diameter within the range of the average diameter rm±20% accounts for preferably not less than 60%, more preferably not less than 70%, and still more preferably not less than 80% of the weight of the total silver halide grains. The average grain diameter (rm) herein is defined as the grain diameter ri in the instance where the product of frequency ni of the grain having a grain diameter ri and $ri^3$, i.e., $ni \times ri^3$, comes to the maximum (rounded to three decimal places). Herein, the grain diameter, in the case of a spherical silver halide grain, is the diameter itself, while in the case of a non-spherical grain, is the diameter of an equivalent circle to the grain projected area. The grain diameter can be obtained by a method in which the grain is electron microphotographically enlarged 10,000 to 50,000 times, and the diameter of the enlarged grain image on its photo print or the area of the projection grain image enlarged likewise is actually measured. (The number of grains for measurement shall be 1000 or more at random.)

The most preferred highly monodispersed emulsion is comprised of silver halide grains having a grain diameter distribution width of not more than 20%, the distribution width being defined by grain diameter standard deviation/average diameter×100=distribution width (%)

wherein the above average grain diameter and the grain diameter standard deviation are to be found from the earlier defined ri.

The monodisperse emulsion can be obtained by adding an aqueous silver salt solution and an aqueous halide solution under controlled pAg and pH conditions according to a double-jet precipitation method. For determination of the addition rate, reference can be made to JP-A Nos. 54-48521 and 58-49938. To obtain a high monodisperse emulsion, there can be used the method for growing the grain in the presence of a tetrazaindene compound, which was disclosed in JP-A No. 60-122935. In addition, it is also preferable to add two or more kinds of mono-dispersed emulsions in one sensitive layer.

The grain size in each emulsion layer of the photographic material of the present invention can be determined from a wide range, considering various properties including performance thereof, specifically, its sensitivity, sensitivity balance, color separation sharpness and graininess. In one preferable embodiment of the present invention, the grain size of silver halide is preferably 0.1 through 0.6 μm for the red-sensitive layer emulsion, 0.15 μm through 0.8 μm for the green-sensitive layer emulsion and 0.3 through 1.2 μm for the blue-sensitive layer emulsion.

In the photographic material of the present invention, it is preferable to contain a nitrogen-containing heterocyclic compound having a mercapto group. The preferable compounds are those represented by Formula [XI] described in JP-A No. 6-95283, page 19, right column, line 20th through 49th. The more preferable compounds are those represented by Formula [XII], Formula [XIII] and [XIV] described in the above-mentioned specification, page 20, left column, line 5th through page 20, right column, line 2nd. Exemplary examples of the compounds include Compounds (1) through (39) described in JP-A No. 64-73338, page 11 through page 15.

The addition amount of the above-mentioned mercapto compound may optionally be varied depending of the kind of compounds used and the added layer. Ordinarily, when added to the silver halide emulsion layer, it is preferable to be $10^{-8}$ through $10^{-2}$ mol and more preferable to be $10^{-6}$ through $10^{-3}$ mol.

As a yellow coupler contained in the yellow image forming layer are preferably employed known acylacetoanilide type yellow couplers. Examples thereof include compounds Y-i-1 through Y-I-55 described in JP-A 241345, page 5-9; compounds Y-1 to Y-30 described in JP-A 3-209466 page 11-14 and couplers represented by general formula [Y-I] described in JP-A 6-95283 page 21.

In the photographic materials of the present invention, λmax of the spectral absorption of the yellow image is preferably not less than 425 nm and $\lambda_{L0.2}$ is preferably not more than 515 nm. The λmax and $\lambda_{L0.2}$ of the spectral absorption of the yellow image are defined as follows. Thus, when the yellow image forming layer is subjected to exposure and processing so as to form the yellow image having the maximum absorbance of 1.00 in the range of 400 to 500 nm, without forming any image other than the yellow image forming layer, the wavelength at the maximum absorbance is defined as λmax and $\lambda_{L0.2}$ is defined as a wavelength which is longer than that at the maximum absorbance of 1.0 and at which the absorbance is 0.2.

The yellow coupler is preferably employed in an amount of $1×10^{-3}$ to 1 mol, and more preferably $1×10^{-2}$ to $8×10^{-1}$ mol per mol of silver halide.

Preferred magenta couplers used in the present invention are compounds represented by [M-1] described in JP-A No. 95283/1994, page 7, right column in terms of superior spectral absorption properties of coloring dyes. Practical example of preferable compounds include compounds M-1 through M-19 described in the above-mentioned specification, page 8 through page 11. In addition, as other examples, compounds M-1 through M-61 described in European Patent No. 0,273,712, pp. 6 through 21 and compounds 1 through 223 described in European Patent No. 0,235,913, pp. 36 through 92, except those described above. The above-mentioned couplers may be used in combination with other kinds of magenta couplers. Ordinarily, they can be used preferably in a range of $1×10^{-3}$ to 1 mol and more preferably in a range of $1×10^{-2}$ to $8×10^{-1}$ mol per mol of silver halide.

In the photographic material of the present invention, spectral absorption $\lambda$max of the magenta image is preferably 530 through 560 nm and $\lambda_{L0.2}$ is 580 through 635 nm. The $\lambda$max and $\lambda_{L0.2}$ of the spectral absorption of the magenta image are defined as follows. Thus, when the magenta image forming layer is subjected to exposure and processing so as to form the yellow image having the maximum absorbance of 1.00 in the range of 500 to 600 nm, without forming any image other than the magenta image forming layer, the wavelength at the maximum absorbance is defined as $\lambda$max and $\lambda_{L0.2}$ is defined as a wavelength which is longer than that at the maximum absorbance of 1.0 and at which the absorbance is 0.2.

It is preferable that a yellow coupler be contained, in addition to a magenta coupler, in the magenta image forming layer of the photographic material of the present invention. The difference of pKa of the above-mentioned couplers is preferably within 2 and more preferably within 1.5. The preferable yellow coupler contained in the magenta image forming layer of the present invention is a coupler represented by Formula [Y-Ia] described in JP-A 6-95283, page 12, right column. Of the couplers represented by the above-mentioned specification, the more preferable ones are those having a pKa value which is not lower than that of a coupler represented by a combined coupler [M-1] by 3, when it is combined with a magenta coupler represented by [M-1].

Practical examples of preferable compounds include, in addition to compounds Y-1 and Y-2 described in JP-A No. 6-95283, compounds (Y-1) through (Y-58) described in JP-A No. 139542/1990, pp. 13 through 17, but the compounds are not limited these compounds.

As a cyan coupler contained in the cyan image forming layer according to the present invention, conventional types such as phenol, naphthol or imidazole couplers can be used. Typically, phenol type couplers which are each substituted by an alkyl group, an acylamino group or a ureido group, naphthol type couplers formed from a 5-aminonaphthol nucleus and a two-equivalent type couplers having an oxygen atom-introduced leaving group.

The silver halide photographic material used in the invention preferably contains a cyan coupler represented by the following formula (I) or (II):

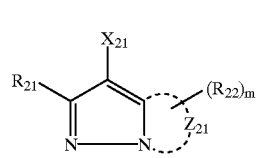

formula (I)

wherein
$R_{21}$ is a hydrogen atom or a substituent;
$R_{22}$ is a substituent; and
m is an integer of 0, 1 or 2, provided that when m is 0, $R_{21}$ is an electron-withdrawing group, when m is 1 or 2, at least one of $R_{21}$ and $R_{22}$ is an electron-withdrawing group, and when m is 2, plural m's may be the same of different from each other;
$Z_{21}$ is a non-metallic atom group necessary to form a nitrogen containing 5-membered heterocyclic ring, which may be condensed with a benzene ring; and
$X_{21}$ is a hydrogen atom or a group capable of being released upon reaction with an oxidation product of a color developing agent;

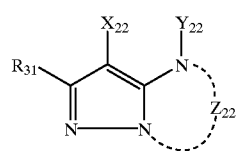

formula (II)

wherein
$R_{31}$ and $Y_{22}$ is a hydrogen atom or a substituent;
$X_{22}$ is a hydrogen atom or a group capable of being released upon reaction with an oxidation product of a color developing agent;
$Z_{22}$ is a nonmetallic atom group capable of forming, with —N($Y_{22}$)— a nitrogen containing 6-membered heterocyclic ring, which may be substituted or be condensed with a benzene ring.

In formula (II), the electron-withdrawing group is a substituent having a Hammett's substituent constant ($\sigma$p) of 0.20 or more. Examples thereof include sulfonyl, sulfinyl, sulfonyloxy, sulfamoyl, phospholyl, carbamoyl, acyl, acyloxy, oxycarbonyl, carboxy, cyano, nitro, halogenated alkoxy, halogenated aryloxy, pyrrolyl, tetrazolyl and a halogen atom. Exemplary examples of a sulfonyl group include alkylsulfonyl, arylsulfonyl, halogenated alkylsulfonyl and halogenated arylsulfonyl. Examples of a sulfinyl group include alkylsulfinyl and arylsulfinyl. Examples of a sulfonyloxy group include alkylsulfonyloxy and arylsulfonyloxy. Examples of a sulfamoyl group include N,N-dialkylsulfamoyl, N,N-diarylsulfamoyl and N-alkyl-N-arylsulfamoyl. Examples of a phospholyl group include alkoxyphospholyl, aryloxyphospholyl, alkylphospholyl and arylphospholyl. Examples of a carbamoyl group include N,N-dialkylcarbamoyl, N,N-diarylcarbamoyl and N-alkyl-N-arylcarbamoyl. Examples of a acyl group include alkylcarbonyl and arylcarbonyl. An acyloxy group is preferably an alkylcarbonyloxy group. Examples of an oxycarbonyl group include alkoxycarbonyl and aryloxycarbonyl. A halogenated alkoxy group is preferably $\alpha$-halogenated alkoxy group. Examples of a halogenated aryloxy group include tetrafluoroaryloxy and pentafluoroaryloxy. Examples of a pyrrolyl group include 1-pyrrolyl. Examples of a tetrazolyl group include 1-tetrazolyl. In addition to the above groups, trifluoromethyl, heptafluoro-i-propyl, nonylfluoro-t-butyl, tetrafluoroaryl and pentafluoroaryl are also preferable groups.

In formula (I), of the substituents represented by $R_{21}$ and $R_{22}$, representative examples of those other than the electron-withdrawing group and group capable of forming a hydrogen bond include an alkyl group, aryl group, anilino group, acylamino group, sulfonamido group, alkylthio group, arylthio group, alkenyl group, cycloalkyl group, cycloalkenyl group, alkynyl group, heterocyclic group, alkoxy group, heterocyclic-oxy group, siloxy group, amino group, alkylamino group, imido group, ureido group, sulfamoylamino group, alkoxycarbonylamino group, aryloxycarbonylamino group, alkoxycarbonyl group, aryloxycarbonyl group, heterocyclic-thio group, thioureido group, hydroxy group, mercapto group, spiro-compound residue and bridged hydrocarbon compound residue.

The alkyl group is preferably one having 1 to 32 carbon atoms, which may be straight-chained or branched. The aryl group is preferably a phenyl group. The acylamino group includes an alkylcarbonylamino group and arylcarbonylamino group. The sulfonamido group includes alkylsulfonylamino group and arylsulfonylamino group. An alkyl or aryl component in the alkylthio group and the arylthio group includes the above-described alkyl group and aryl group. The cycloalkyl group is preferably one having 2 to 32 carbon atoms; and the alkenyl group, which may be straight-chained or branched, is preferably one having 3 to 12 carbon atom and more preferably 5 to 7 carbon atoms. The cycloalkenyl group is preferably one having 3 to 12 carbon atoms and more preferably 5 to 7 carbon atoms. The ureido group includes an alkylureido group and arylureido group; the sulfamoylamino group includes an alkylsulfamoylamino group and arylsulfamoylamino group; the heterocyclic group is preferably 5 to 7-membered one and examples thereof include 2-furyl, 2-thienyl, 2-pyrimidinyl and 2-benzothiazolyl; the heterocyclic-oxy group is preferably 5 to 7-membered one, and examples thereof include 3,4,5,6-tetrahydropyranyl-2-oxy group and 1-phenyltetrazole-5-oxy group; the heterocyclic-thio group is preferably 5 to 7-membered one and examples thereof include 2-pyridylthio, 2-benzothiazolylthio, 2,4-diphenoxy-1,3,5-triazole-6-thio; the siloxy group includes trimethylsiloxy, triethylsiloxy and dimethylbutylsiloxy; the imido group includes succinic acid imido, 3-heptadecylsuccinic acid imido, phthalic acid imido and glutarimido; the spiro-compound residue includes spiro[3,3]heptane-1-yl; and the bridged hydrocarbon compound residue includes bicyclo[2.2.1]heptane-1-yl, tricyclo[3.3.1.1$^{3.7}$]decane-1-yl and 7,7-dimethyl-bicyclo[2.2.1]heptane-1-yl. These groups may be substituted by a group, such as a ballast group including a long-chained hydrocarbon group and polymer residue.

Examples of the group represented by $X_{21}$ in formula (I), which is capable of being released upon reaction with an oxidation product of a color developing agent, include a halogen atom (e.g., chlorine atom, bromine atom, fluorine atom), an alkoxy group, aryloxy group, heterocyclic-oxy group, acyloxy group, sulfonyloxy group, group, aryloxycarbonyl group, alkyloxalyloxy group, alkoxyoxalyloxy group, alkylthio group, arylthio group, heterocyclic-thio group, alkyloxythiocarbonylthio group, acylamino group, sulfonamido group, a nitrogen containing heterocyclic group having a bonding site at a nitrogen atom, alkyloxycarbonylamino group, aryloxycarbonylamino group and a group represented by the following formula:

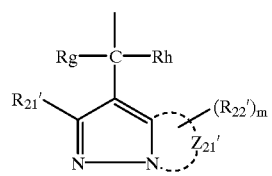

in which $R_{21}'$, $R_{22}'$ and $Z_{21}'$ are each the same as defined in $R_{21}$, $R_{22}$ and $Z_{21}$ described above;

Rg and Rh are each a hydrogen atom, alkyl, aryl or a heterocyclic group, and preferably a hydrogen atom a halogen atom, alkoxy, aryloxy, alkylthio and N-attached nitrogen-containing heterocyclic group, specifically, examples of the nitrogen containing heterocyclic group $Z_{21}'$ include a pyrazole ring, an imidazole ring, a benzimidazole ring, a triazole ring and a tetrazole ring.

The compound represented by formula (I) is exemplarily compounds represented by the following formulas (a) to (g):

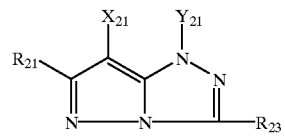
formula (a)

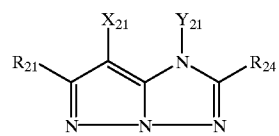
formula (b)

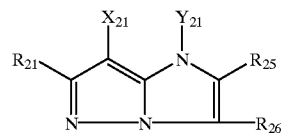
formula (c)

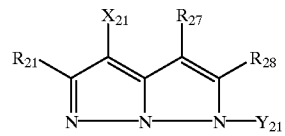
formula (d)

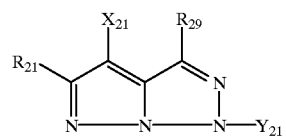
formula (e)

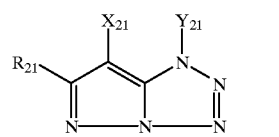
formula (f)

-continued

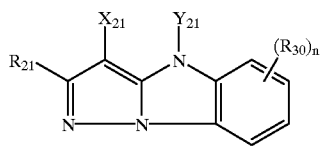

formula (g)

In the above formulas, at least one of $R_{21}$ and $R_{23}$ of formula (a), at least one of $R_{21}$ and $R_{24}$ of formula (b), at least one of $R_{21}$, $R_{25}$ and $R_{26}$ of formula (c), at least one of $R_{21}$, $R_{27}$ and $R_{28}$ of formula (d), at least one of $R_{21}$ and $R_{29}$, $R_{21}$ of formula (f) and at least one of $R_{21}$ and $R_{30}$ of formula (g) are respectively an electron-withdrawing groups. $X_{21}$ is the same as defined in $X_{21}$ of formula (I) and n is an integer of 0 to 4. $Y_{21}$ is a hydrogen atom or a substituent. This substituent is one capable of leaving from the cyan coupler before the cyan coupler is reacted with an oxidation product of a color developing agent; and examples thereof include a group capable of leaving under alkaline conditions described in JP-A 61-228444, and a substituent capable of coupling-off upon reaction with an oxidation product of a color developing agent, described in JP-A 56-133734. Of these, preferred $Y_{21}$ is a hydrogen atom. Further, in formulas (a) to (g), substituents $R_{21}$ to $R_{29}$ other than the electron-withdrawing group are each a hydrogen atom or substituent. The substituent of $R_{30}$ other than an electron-withdrawing group is not specifically limited, and exemplary examples thereof are those exemplified as $R_{21}$ and $R_{22}$ other than electron-withdrawing groups. This cyan coupler having an electron-withdrawing group can be readily synthesized according to the method described in JP-A 62-47323, 62-53417, 62-62162, 62-53418, 62-62163, 62-48895 and 62-99950.

The cyan coupler represented by formula (II) has a structure of a heterocyclic 6-membered ring which is condensed with a pyrazole ring. A substituent represented by $R_{31}$ is not specifically limited, and exemplary examples thereof include alkyl, aryl, anilino, acylamino, sulfonamido, alkylthio, arylthio, alkenyl and cycloalkyl. In addition, a halogen atom, cycloalkenyl, alkynyl, heterocyclic group, sulfonyl, sulfinyl, phosphonyl, acyl, carbamoyl, sulfamoyl, cyano, alkoxy, sulfonyloxy, alkyloxy, heterocyclic-oxy, siloxy, acyloxy, carbamoyloxy, amino, alkylamino, imido, ureido, sulfamoylamino, alkoxycarbonylamino, aryloxycarbonylamino, alkoxycarbonyl, aryloxycarbonyl, heterocyclic-thio, thioureido, carboxy, hydroxy, mercapto, nitro, sulfo, spiro-compound residue and bridged hydrocarbon compound residue.

The alkyl group represented by $R_{31}$ is preferably one having 1 to 32 carbon atoms, which may be straight-chained or branched. The aryl group represented by $R_{31}$ is a aryl group, and preferably a phenyl group. The acylamino group represented by $R_{31}$ is preferably alkylcarbonylamino and arylcarbonylamino groups. Examples of the sulfonamido group represented by $R_{31}$ include alkylsulfonylamino and arylsulfonylamino. The alkyl component and aryl component of the alkylthio and arylthio groups represented by $R_{31}$ are the same as the alkyl and aryl groups $R_{31}$ described above. The alkenyl group represented by $R_{31}$ is one having 2 to 32 carbon atoms, the cycloalkyl group represented by $R_{31}$ is one having 3 to 12 carbon atoms, and preferably 5 to 7 carbon atoms, and the alkenyl group may be straight-chained or branched. The sulfonyl group represented by $R_{31}$ is alkylsulfonyl or arylsulfonyl. The sulfinyl group includes alkylsulfinyl and arylsulfinyl; the phosphonyl group includes alkylphosphonyl, alkoxyphosphonyl, aryloxyphos-phonyl and arylphosphonyl; the acyl group includes alkylcarbonyl and arylcarbonyl; the carbamoyl group includes alkylcarbamoyl and arylcarbamoyl; the sulfamoyl group includes alkylsulfamoyl and arylsulfamoyl; the acyloxy group includes alkylcarbonyloxy and arylcarbonyloxy; the carbamoyloxy group includes alkylcarbamoyloxy and arylcarbamoyloxy; the ureido group includes alkylureido and arylureido; the sulfamoylamino group includes alkylsulfamoylamino and arylsulfamoylamino; the heterocyclic group is preferably 5- to 7-membered ring, including 2-furyl, 2-thienyl, 2-pyrimidinyl, 2-benzothiazolyl, 1-pyrrolyl and 1-tetrazolyl; the heterocyclic-oxy group is preferably one having 5- to 7-membered heterocyclic ring, including 3,4,5,6-tetrahydropyranyl-2-oxy and 1-phenyltetrazole-5-oxy; the heterocyclic-thio group is preferably 5-to 7-membered one, including 2-pyridylthio, 2-benzothiazolylthio, and 2,4-diphenoxy-1,3,5-triazole-6-thio; the siloxy group includes trimethylsiloxy, triethylsiloxy and dimethylbutylsiloxy; the imido group includes succinimido, 3-heptadecylsuccinimido, phthalimido and glutarimido; the spiro compound residue includes spiro[3.3]heptane-1-yl; and the bridged hydrocarbon compound residue includes bicyclo[2.2.1]heptane-1-yl, tricyclo[3.1.1$^{3.7}$]decane-1-yl and 7,7-dimethyl-bicyclo[2.2.1]heptane-1-yl. The groups described above each may contain a substituent including a ballasted group such as long-chained hydrocarbon group or a polymer residue.

Example of the group capable of being released upon reaction with an oxidation product, represented by $X_{22}$ include a halogen atom (e.g., chlorine, bromine, iodine, etc.), alkoxy, aryloxy, heterocyclic-oxy, acyloxy, sulfonyloxy, alkoxycarbonyloxy, aryloxycarbonyl, alkyloxalyloxy, alkoxyoxalyloxy, alkylthio, arylthio, heterocyclic-thio, alkyloxythiocarbonylthio, acylamino, sulfonamido, n-attached nitrogen containing heterocyclic group, alkyloxycarbonylamino, aryloxycarbonylamino, carboxyl, and the following group:

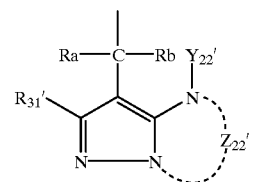

where $R_{31}'$ and $Z_{22}'$ are respectively the same as $R_{31}$ and $Z_{22}$ described above, and Ra and Rb are each a hydrogen atom, alkyl, aryl or a heterocyclic group. Of these, a hydrogen atom, halogen atom, alkoxy, aryloxy, alkylthio, arylthio and N-attached nitrogen containing heterocyclic group.

The cyan coupler represented by formula (II) is preferably one represented by the following formula (IIa):

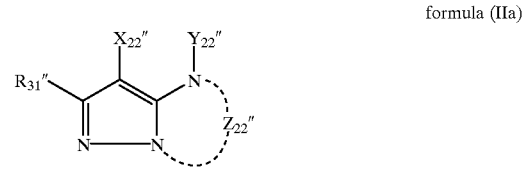

formula (IIa)

wherein
  $Z_{22}''$ is a nonmetallic atom group necessary to form a 6-membered nitrogen containing ring containing at least a carbonyl group or at least a sulfonyl group and condensed with a pyrazole ring, and in place of the pyrazole ring, a benzene ring may be condensed;

$R_{31}''$ and $Y_{22}''$ are each a hydrogen atom or a substituent; and $X_{22}''$ is the same as defined in $X_{22}$ of formula (II).

In formula (II), the 6-membered nitrogen containing heterocyclic ring formed by $Z_{22}$ is preferably a 6π-electron system or 8π-electron system, which contains at least one —N($Y_{22}$)— and 1 to 4 nitrogen atoms. The carbonyl group contained in the 6-membered ring is —CO— or —CS, and the sulfonyl group contained in the 6-membered ring is —SO$_2$—. $Y_{22}$ is a hydrogen atom or a substituent and the substituent represented by $Y_{22}$ is preferably a group capable of leaving after the compound is reacted with an oxidation product of a developing agent. The substituent represented by $Y_{22}$ is, for example, a group capable of leaving under the alkaline condition described in 61-228444 or a group capable of coupling-off upon reaction with an oxidation product of a developing agent; and $Y_{22}$ is preferably a hydrogen atom.

The cyan coupler represented by formula (II) is preferably compounds represented by formulas (A) to (M):

formula (A)

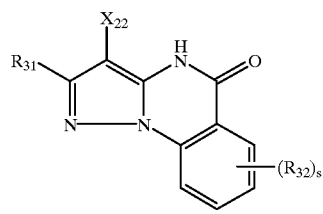

formula (B)

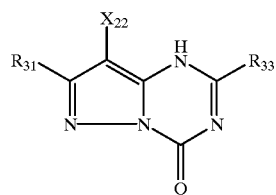

formula (C)

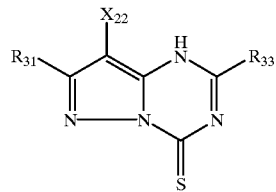

formula (D)

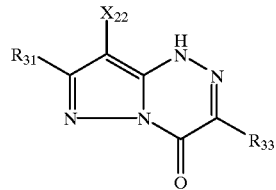

formula (E)

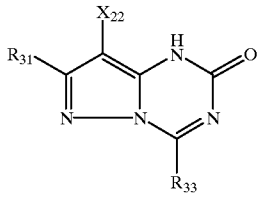

formula (F)

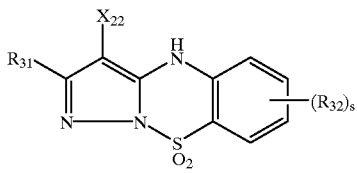

formula (G)

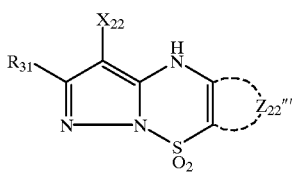

formula (H)

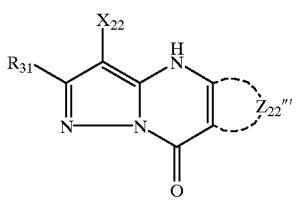

formula (I)

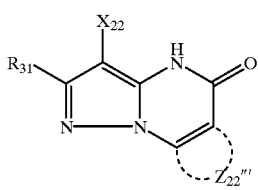

formula (J)

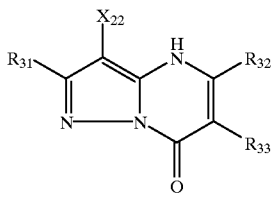

formula (K)

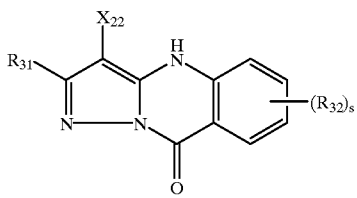

formula (L)

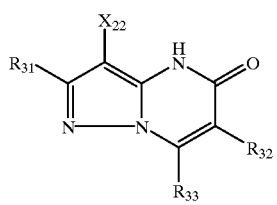

formula (M)

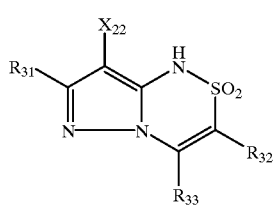

wherein $R_{31}$, $R_{32}$ and $R_{33}$ are the same as $R_{31}$ in formula (II) and $X_{22}$ is the same as $X_{22}$ in formula (II). In formulas (A), (F) and (K), p is an integer of 0 to 4 and when p is 2 to 4, plural $R_{32}$'s may be the same or different from the other(s). $R_2$ and $R_{33}$ in formulas (J), (L) and (M) is the same as defined in $R_{31}$ of formula (II), provided that $R_{32}$ is not to be hydroxy, and $Z_{22}'''$ is an atomic group necessary to form a heterocyclic ring. $R_{32}$ and $R_{33}$ are preferably alkyl, aryl, carboxy, oxycarbonyl, cyano, alkoxy, aryloxy, amino, amido, a hydrogen atom or a halogen atom.

The cyan coupler of formula (II) include couplers described in Japanese patent Application No. 63-321488, 64-36996, 64-41183, 64-52293, 64-97598, 64-9884 and 64-125052 and can be synthesized by the method described therein or references cited therein.

Exemplary examples of the cyan coupler represented by formula (I) or (II) are shown below, but the coupler is not limited to these examples and further including, for example, C-1 to C-35 described in JP-A 1-144052 at page 7, right upper column to page 9 right upper column and A-1 to M-8 described in JP-A 4-133054 at page 6, right lower column to page 12, right lower column.

I-1

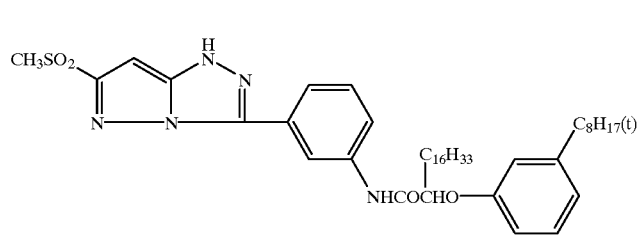

I-2

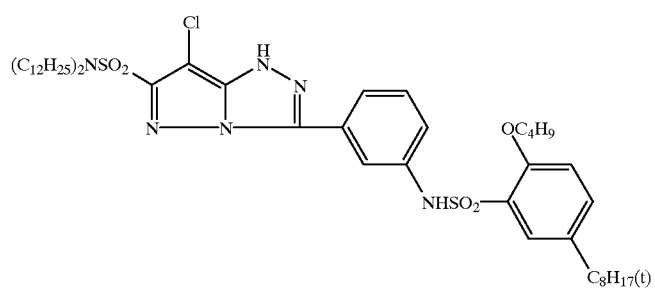

I-3

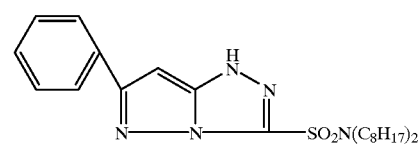

I-4

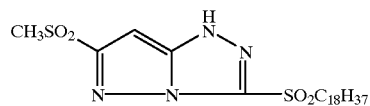

I-5

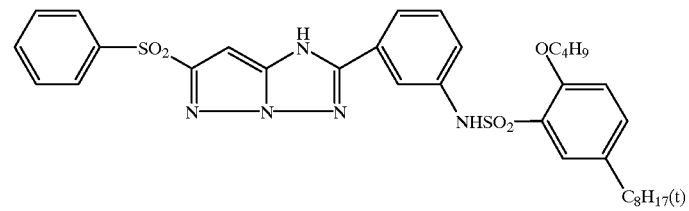

-continued
I-6
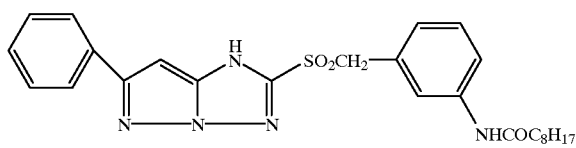
I-7
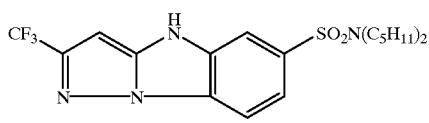
I-8
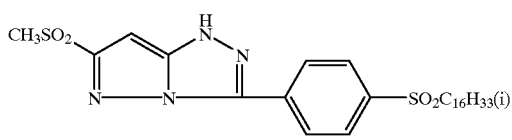
I-9
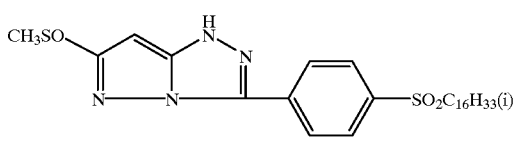
I-10
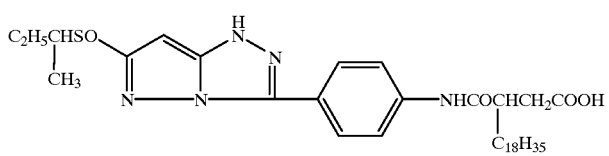
I-11
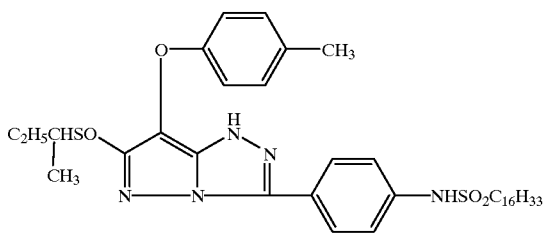
I-12
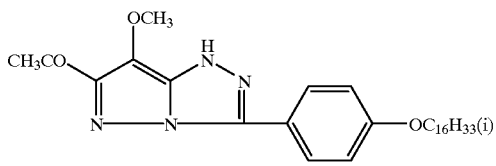
I-13
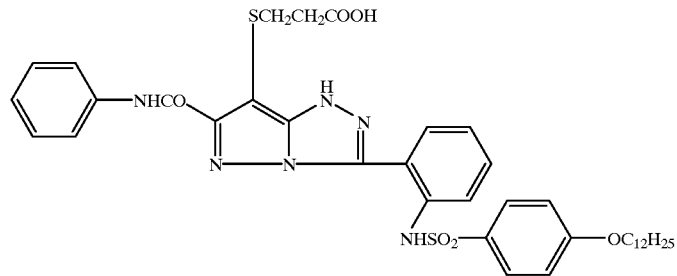

I-14
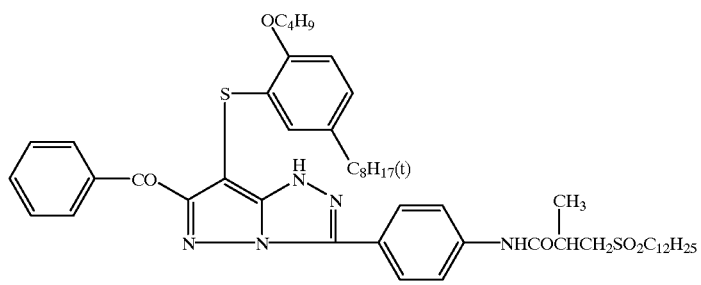
I-15
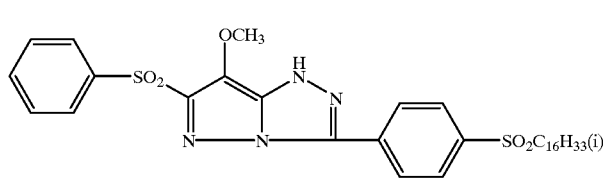
I-16
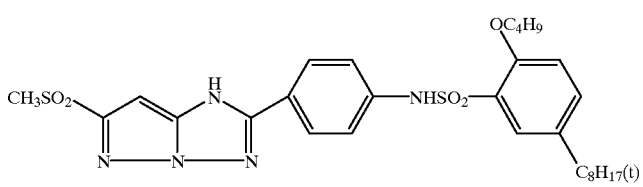
I-17
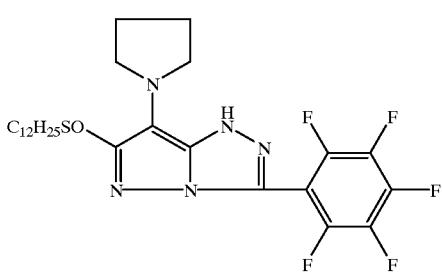
I-18
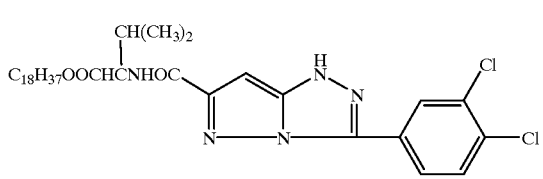
II-1
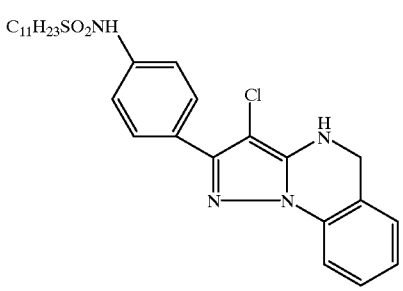

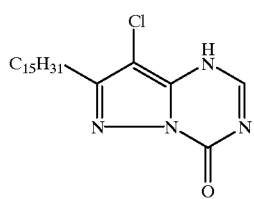
II-2
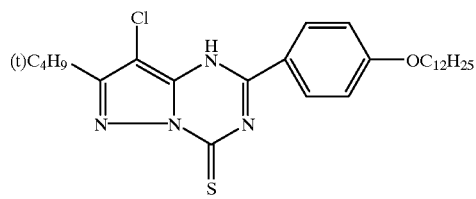
II-3
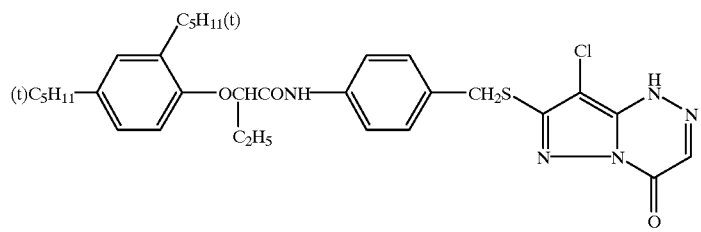
II-4
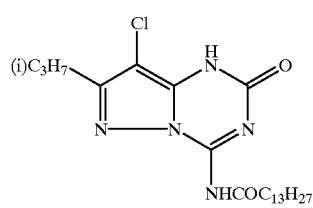
II-5
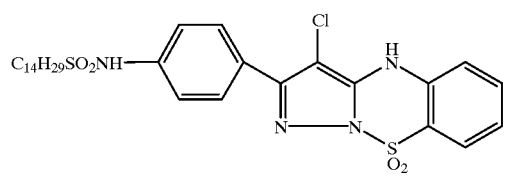
II-6
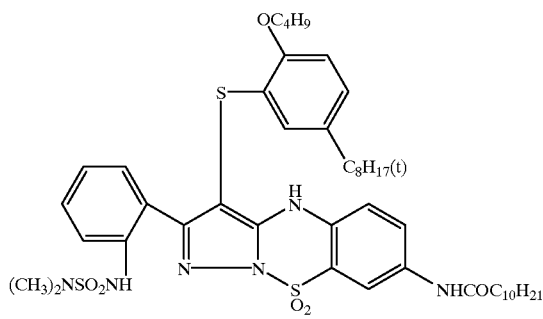
II-7
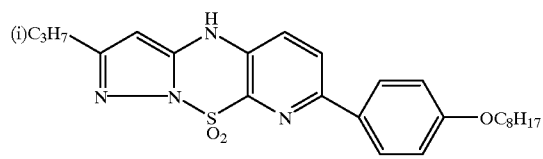
II-8

II-9
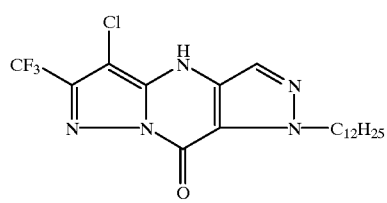
II-10
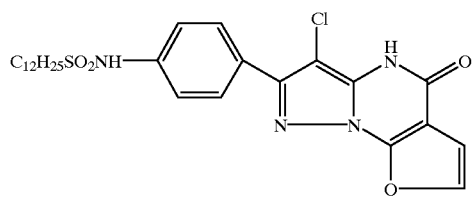
II-11
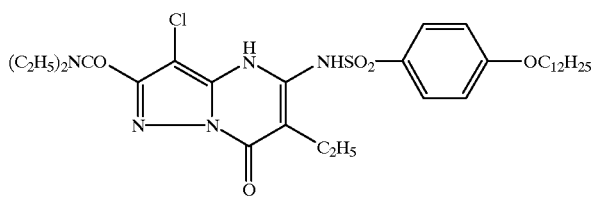
II-12
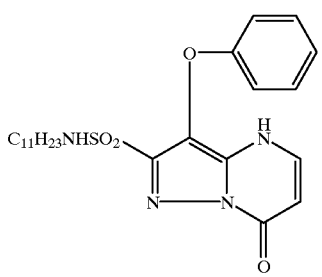
II-13
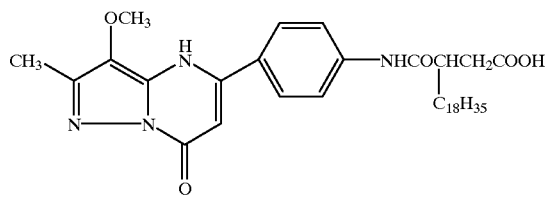
II-14
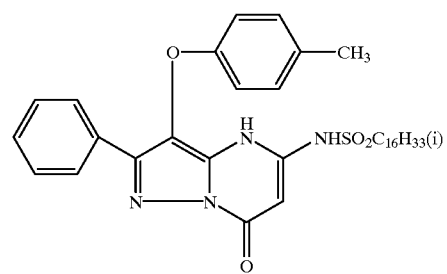
II-15
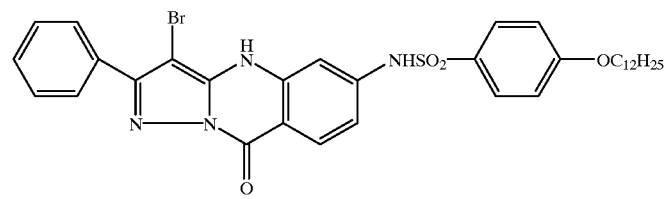

II-16

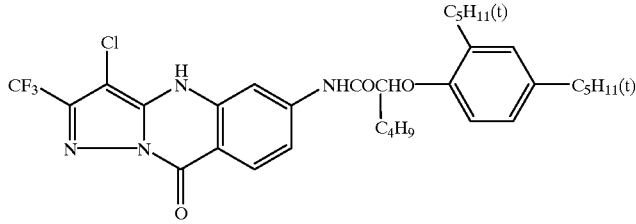

II-17

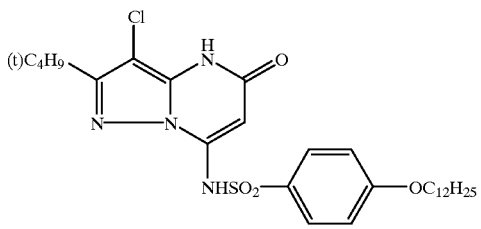

II-18

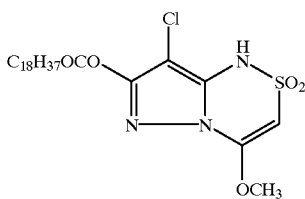

The cyan coupler described above is used within the range of $1\times10^{-3}$ to 1 mol, and preferably $1\times10^{-2}$ to $8\times10^{-1}$ mol per mol of silver halide. Further this cyan coupler can be used in combination with another cyan coupler. Applicable to incorporate the cyan coupler into the color photographic material used in the invention are known techniques employed in conventional cyan couplers. the coupler is dissolver in a high boiling solvent, optionally in combination with a low boiling solvent and incorporated in a silver halide emulsion in the form of a dispersion. Further, hydroquinone derivatives, a UV absorbent or an anti-fading additive may optionally be added thereto.

The yellow image forming layer, the magenta image forming layer and the cyan image forming layer relating to the present invention are coated on a support with an arbitrary order of coating from the support. One preferable embodiment is that, from the support, are the cyan image forming layer, the magenta image forming layer and the yellow image forming layer. In addition, if necessary, a black image forming layer, an intermediate layer, a filter layer and a protective layer may also be provided.

To each of the above-mentioned couplers, to prevent color fading of the formed dye image due to light, heat and humidity, an anti-fading agent may be added singly or in combination. The preferable compounds or a magenta dye are phenyl ether type compounds represented by Formulas I and II in JP-A No. 2-66541, phenol type compounds represented by Formula IIIB described in JP-A No. 3-174150, amine type compounds represented by Formula A described in JP-A No. 64-90445 and metallic complexes represented by Formulas XII, XIII, XIV and XV described in JP-A No. 62-182741. The preferable compounds to form a yellow dye and a cyan dye are compounds represented by Formula I' described in JP-A No. 1-196049 and compounds represented by Formula II described in JP-A No. 5-11417. When an oil-in-water type-emulsifying dispersion method is employed for adding couplers and other organic compounds used for the photographic material of the present invention, in a water-insoluble high boiling organic solvent, whose boiling point is 150° C. or more, a low boiling and/or a water-soluble organic solvent are combined if necessary and dissolved. In a hydrophilic binder such as an aqueous gelatin solution, the above-mentioned solutions are emulsified and dispersed by the use of a surfactant. As a dispersing means, a stirrer, a homogenizer, a colloidal mill, a flow jet mixer and a supersonic dispersing machine may be used.

After dispersion, or concurrently with dispersion, a step to remove a low boiling organic solvent may be introduced. Preferred examples of the high boiling organic solvent capable of being used for dissolving a coupler for dispersion include phthalic acid esters such as dioctylphthalate, diisodecylphthalate and dibutylphthalate, phosphoric acid ester such as tricresyl phosphate and trioctylphosphate and phosphine oxides such as trioctyl phosphine oxide. The dielectric constant of the high boiling organic solvent is preferably 3.5 to 7. In addition, two or more kinds of the high boiling organic solvent may be used in combination.

As a high boiling organic solvent, the specifically preferable compounds are those represented by [HBS-I] and [HBS-II] described in JP-A No. 6-95283, page 22, and more specifically preferable compounds are those represented by [HBS-II]. Practical compounds are compounds I-1 through II-95 described in JP-A No. 2-124568, page 53 through 68.

As a surfactant used for adjusting surface tension when dispersing or coating photographic additives, the preferable compounds are those containing a hydrophobic group having 8 through 30 carbon atoms and a sulfonic acid group or its salts in a molecule. Exemplary examples thereof include A-1 through A-11 described in JP-A No. 64-26854. In addition, surfactants, in which a fluorine atom is substituted to an alkyl group, are also preferably used. The dispersion is conventionally added to a coating solution containing a silver halide emulsion. The elapsed time from dispersion until addition to the coating solution and the time from addition to the coating solution until coating are preferably short. They are respectively preferably within 10 hours, more preferably within 3 hours and still more preferably within 20 minutes.

It is preferable that a compound reacting with the oxidation product of a color developing agent be incorporated into a layer located between light-sensitive layers for preventing color staining and that the compound is added to the silver halide emulsion layer to decrease fogging. As a compound for such purposes, hydroquinone derivatives are preferable, and dialkylhydroquinone such as 2,5-di-t-octyl hydroquinone are more preferable. The specifically preferred compound is a compound represented by Formula II described in JP-A No. 4-133056, and compounds II-1 through II-14 described in the above-mentioned specification pp. 13 through 14 and compound 1 described on page 17.

In the photographic material according to the present invention, it is preferable that static fogging is prevented and light-durability of the dye image is improved by adding a UV absorber. The preferable UV absorber is benzotriazoles. The specifically preferable compounds are those represented by Formula III-3 in JP-A No. 1-250944, those represented by Formula III described in JP-A No. 64-66646, UV-1L through UV-27L described in JP-A No. 63-187240, those represented by Formula I described in JP-A No. 4-1633 and those represented by Formulas (I) and (II) described in JP-A No. 5-165144.

It is also to incorporate an oil-soluble dye or a pigment to improve white background. Preferred examples of the oil-soluble dye are compounds 1 through 27 described in JP-A No 2-842, page 8 to 9.

In the photographic material used in the invention, gelatin is preferably used as a binder. Specifically, gelatin, extraction solution of which is subjected to hydrogen peroxide treatment to remove colored components of gelatin; ossein gelatins which are extracted from hydrogen peroxide-treated raw material ossein or manufactured from uncolored raw bone, are preferably used to enhance transmittance. Gelatin used for the present invention may be any of an alkaline-processed ossein gelatin, an acid-processed gelatin, gelatin derivatives and modified gelatins. Specifically, the alkaline-processed ossein gelatin is preferable. The transmittance of the gelatin used in the photographic material relating to the present invention is preferably 70% or more, when a 10% solution is prepared and its transmittance at 420 nm is measured by the use of a spectrophotometer.

The jelly strength of the gelatin used in the present invention (measured by means of a PAGI method) is preferably 250 or more, and more preferably 270 g or more.

The total weight of gelatin contained on the image forming side of the photographic material according to the present invention is preferably less than 11 g/m$^2$. With regard to a lower limit, there is no specific limit. However, 3.0 g/m$^2$ or more is preferable in terms of photographic performance. The amount of gelatin is calculated in conversion to the weight of gelatin having moisture content of 11.0% when measured through a moisture measurement method described in the PAGI method. The ratio of gelatin to total gelatin coated is not specifically limited, but is preferably 20 to 100%.

As a hardener for the binders, a vinylsulfone type hardener and a chlorotriazine type hardener are preferably used independently or two or more of them are used in combination. Compounds described in JP-A Nos. 61-249054 and 61-245153 are preferably employed. It is also preferable to add antiseptics and anti-mildew agents described in JP-A No. 3-157646 in a colloidal layer to prevent propagation of mildew and bacteria which adversely affect photographic performance and image storage stability.

The silver halide used the present invention may be spectrally sensitized by the use of conventional sensitizing dye(s). Combined use of sensitizing dyes used for super-sensitization of an internal latent image forming silver halide emulsion and a negative type silver halide emulsion is also useful for the silver halide emulsion of the present invention. With regard to sensitizing dyes, Research Disclosure (hereinafter, abbreviated as RD) 15162 and 17643 are referred.

To the photographic material according to the present invention, it is preferable to add compounds which adjust the gradation of the toe portion of a characteristic curve. The preferable compounds are those represented by Formula [AO-II] described in JP-A No. 6-95283, page 17. As an example of preferable compounds, compounds II-1 through II-8 described on page 18 of the above-mentioned specification are given. The added amount of the above-mentioned [AO-II] is preferably 0.001 to 0.50 g/m$^2$, and more preferably 0.005 to 0.20 g/m$^2$. The compound may be used singly or in combination. In addition, a quinone derivative having a 5 or more carbon atoms may be added to the compound of [AO-II]. However, in any cases, the amount used is preferably in a range of 0.001 through 0.50 g/m$^2$ in total.

It is preferable to incorporate a fluorescent brightening agent into the photographic material of the present invention and/or a processing solution which processes the photographic material of the present invention in terms of improving white background.

The developing solution, the bleach-fixing solution and the stabilizing solution can process a photographic material continuously while respectively replenishing the developing solution, the bleaching solution, the bleach-fixing solution and the stabilizing solution. In the present invention, the replenishing rate of the developing solution is preferably 700 cc or less and more preferably 500 cc or less per 1 m$^2$ of the photographic material. In such cases, the present invention provides effective result. In the case of other processing solutions too, the replenishing amount of the developing solution is preferably 700 cc or less and more preferably 500 cc or less per 1 m$^2$ of the photographic material. In such cases, the present invention can provide effective result. The preferred developing agent usable in the developing solution for developing the photographic material of the present invention include ordinary silver halide developing agents such as hydroquinone, hydroxybenzenes, aminophenols, 3-pyrazolones, ascorbic acid and its derivatives, reductones, phenylenediamines, and mixtures thereof. Specifically, cited are hydroquinone, aminophenol, N-methylaminophenol, 1-phenyl-3-pyrazolidone, 1-phenyl-4,4-dimethyl-3-pyrazolidone, 1-phenyl-4-methyl-4-hydroxymethyl-3-pyrazolidone, ascorbic acid, N,N-diethylaminotoluidine, 4-amino-3-methyl-N-ethyl-N-(p-methanesulfonamidoethyl)-aniline, 4-amino-3-methyl-N-ethyl-N-(β-hydroxyethyl)aniline, 4-amino-N-ethyl-N-(β-hydroxyethyl)aniline and 4-amino-3-methyl-N-ethyl-N-(γ-hydroxypropyl)aniline.

It is also possible to incorporate any of these developing agent into the silver halide emulsion to have the developing agent reacted with the silver halide while immersed in a high pH aqueous solution.

The developing solution used in the present invention may further contain a specific antifogging agent and the development restrainer. Alternatively, it is possible to arbitrarily incorporate such photographic additives used for a developing solution into the component layer(s) of the photographic material.

For the silver halide photographic material in the present invention there may be used any of known photographic additives. The above-referred to known photographic additives include the following compounds described in Research Disclosure RD 17643, page 23, item III to page 29, item XXI and RD 18716, pages 648–651.

To form an image using the photographic material of the present invention, it is preferable to employ a light source unit scanning exposure type automatic processing machine. As practical example of such equipment or system for forming a specifically preferable image, Konsensus L, Konsensus 570 and Konsensus II are cited.

It is preferable to apply the present invention to a photographic material wherein a developing agent is not incorporated in the photographic material. Specifically, it is preferable to apply the present invention to the photographic material having a reflective support to form an image for direct visual stimulation, cited, for example is the photographic material for color proofs.

EXAMPLES

The present invention will be further explained based on examples, but the invention is not limited to these examples.

Example 1

FIG. 1 is a conceptual illustration of an exposure apparatus used in the invention. Plural laser lights radiated from laser light source unit (1), laser light source unit (2) and laser light source unit (3) are exposed, through an optical unit, onto a photographic material amounted on a rotating drum.

Figure 2:
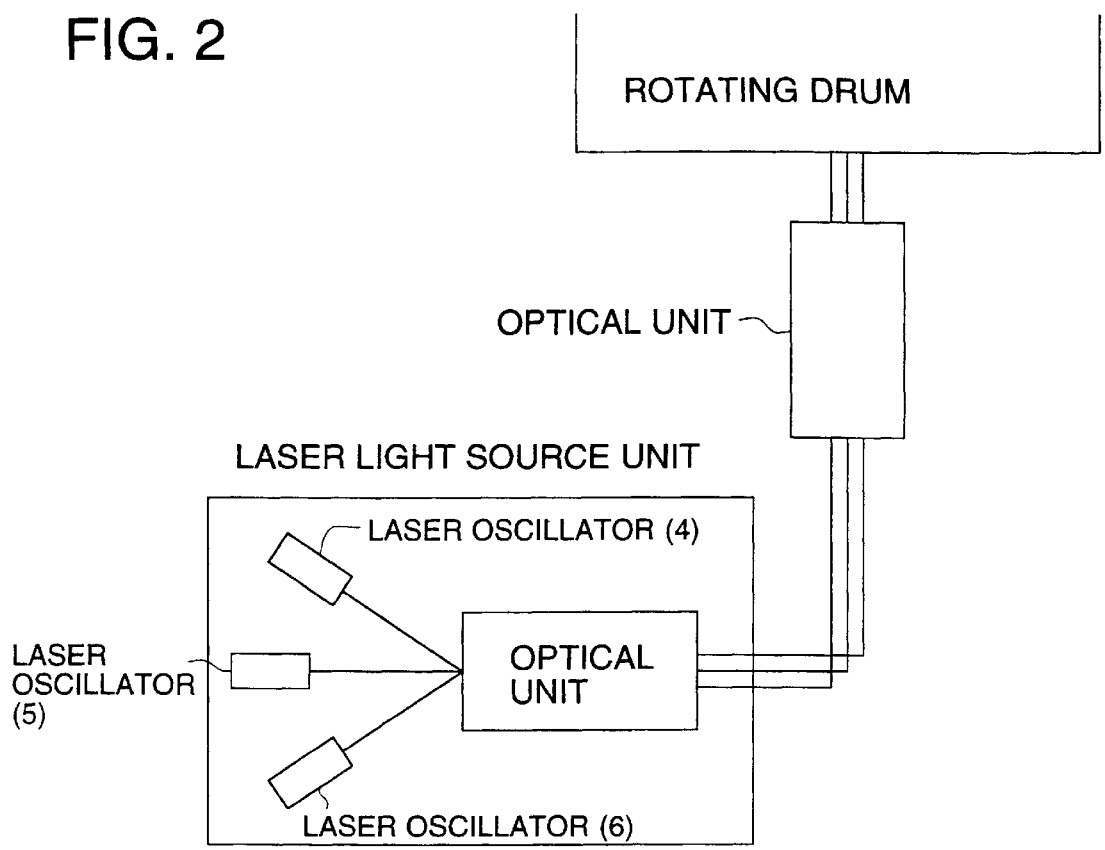
FIG. 2 is a conceptual illustration of a laser light source unit applicable in the invention.

FIG. 2 is a conceptual illustration of a laser light source unit applicable in the invention. A laser light radiated from plural laser oscillators (4), (5) and (6) and having the same wavelength is exposed, as plural beam spots, onto a photographic material amounted on a rotating drum.

Figure 3:
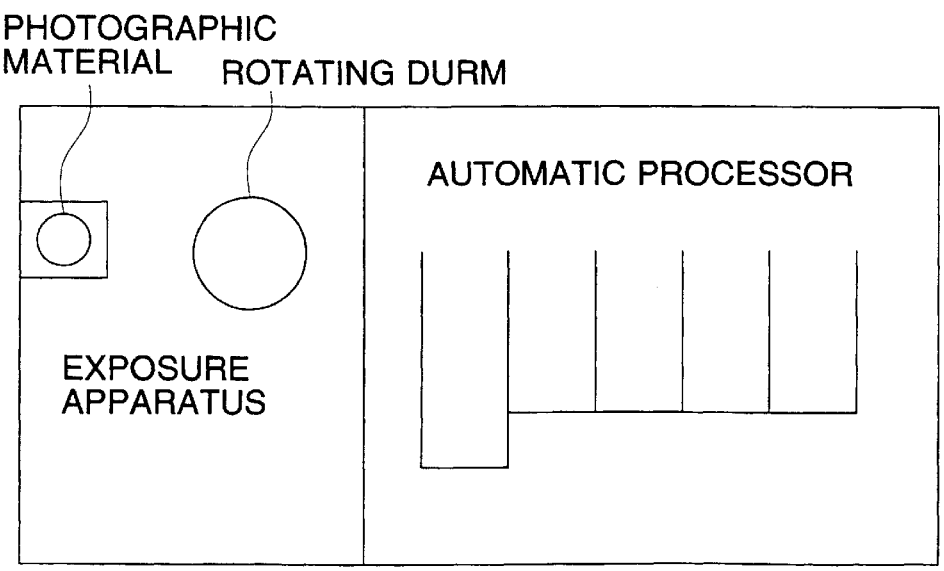
FIG. 3 is a conceptual illustration of an image forming apparatus used in the invention.

FIG. 3 is a conceptual illustration of an image forming apparatus used the invention. A silver halide photographic material which has been wound into roll and contained in a roomlight handling cartridge, is wound around a rotating drum and after exposure, is further subjected to processing to form a final image.

When forming halftone dot images in the apparatus having constitution described above, uniform, sharp images were stably be obtained.
Preparation of Emulsion EM-P1

To an aqueous ossein gelatin solution at a controlled temperature of 40° C. were simultaneously added both an aqueous ammoniacal silver nitrate solution and an aqueous potassium bromide and sodium chloride solution (at a molar ratio of KBr: NaCl=95:5) in a controlled double-jet precipitation process, whereby a cubic silver chlorobromide core grain emulsion having an average grain diameter of 0.30 $\mu$m was obtained. During addition, the pH and pAg were controlled so as to form cubic crystal grains.

To the obtained core grain emulsion further were simultaneously added an aqueous ammoniacal silver nitrate solution and an aqueous potassium bromide and sodium chloride solution (at a molar ratio of KBr:NaCl=40:60) in the controlled double-jet precipitation process to continue formation of a shell phase to cover over the core grain of the above emulsion until reached the average grain diameter of 0.42 $\mu$m. During addition, the pH and pAg were controlled so that cubic grains were obtained. After subjecting to washing to remove water-soluble salts, gelatin was added thereto to obtain emulsion EM-P1. The distribution width of the grain diameter of the emulsion EM-P1 was 8%.
Preparation of Emulsion EM-P2

To an aqueous ossein gelatin solution at a controlled temperature of 40° C. were simultaneously added both an aqueous ammoniacal silver nitrate solution and an aqueous potassium bromide and a sodium chloride solution (at a molar KBr:NaCl ratio of 95:5) in the controlled double-jet precipitation process, whereby a cubic silver chlorobromide grain emulsion having an average grain diameter of 0.18 $\mu$m was obtained. During addition, the pH and pAg were also controlled so that cubic silver halide grains can be obtained. To the core emulsion thus prepared were further simultaneously added an aqueous ammoniacal silver nitrate solution and an aqueous potassium bromide and a sodium chloride solution (at a molar KBr:NaCl ratio of 40:60) in the controlled double-jet precipitation process to form a shell phase until reached an average grain diameter of 0.25 $\mu$m. During addition, the pH and pAg were controlled so that cubic silver halide grains can be obtained. After the above prepared emulsion was subjected to washing to remove water-soluble salts, gelatin was added thereto to obtain emulsion EM-P2. The distribution width of the grain diameters of the emulsion EM-P2 was 8%.
Preparation of Green-sensitive Silver Halide Emulsion Emulsion EM-P1 was optimally spectral-sensitized by adding a sensitizing dye GS-1, followed by adding compound T-1 of 600 mg per mol of silver to obtain a green-sensitive emulsion EM-G1.
Preparation of Red-sensitive Silver Halide Emulsion A red-sensitive emulsion EM-R1 was prepared in the same manner as in the green-sensitive emulsion Em-G1, except that in place of GS-1, sensitizing dyes RS-1 and RS-2 were added to emulsion EM-P2 to optimally perform spectral sensitization.
Preparation of Infrared-sensitive Silver Halide Emulsion A infrared-sensitive emulsion EM-IFR1 was prepared in the same manner as in the green-sensitive emulsion Em-G1, except that in place of GS-1, sensitizing dyes GS-1 and RS-2 were added to emulsion EM-P2 to optimally perform spectral sensitization.
Preparation of Panchromatic Silver Halide Emulsion A panchromatic emulsion EM-H1 was prepared in the same manner as in the green-sensitive emulsion Em-G1, except that in place of GS-1, sensitizing dyes RS-1 and RS-2 were added to emulsion EM-P2 to optimally perform spectral sensitization.

T-1: 4-Hydroxy-methyl-1,3,3a,7-tetrazaindene

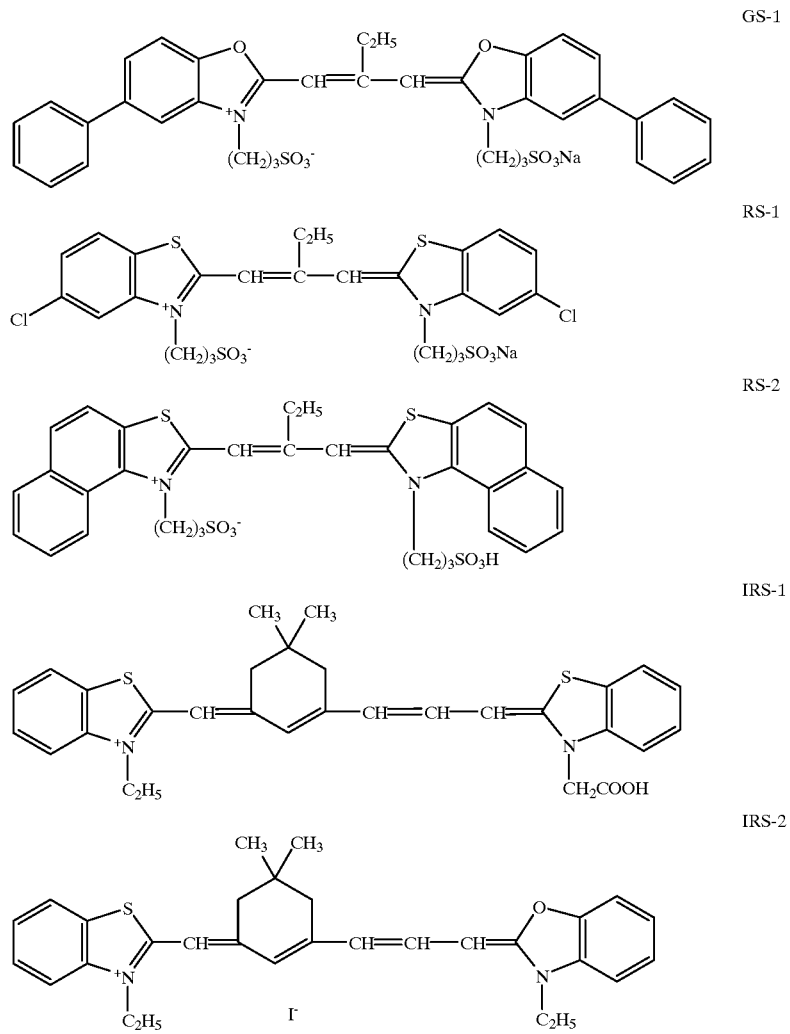

Preparation of Multilayer Silver halide Color Photographic Material

On a paper pulp reflective support of 115 g, 125 g, 135 g or 150 g per $m^2$ in which a high density was laminated on one side and polyethylene containing a dispersed anatase type titanium oxide in a given amount of 15 weight % on the other side, using each of emulsions EM-G1, EM-R1 and EM-IFR1, each layer having the following constitution was coated on a side having the polyethylene layer containing titanium oxide, and on the opposite side, 6.00 g/$m^2$ of gelatin and 0.65 g/$m^2$ of a silica matting agent were coated. A multi-layered silver halide color photographic material sample was thus prepared, in which as a hardener, H-1 and H-2 were further added. As a coating aid and a dispersion aid, surfactants SU-1, SU-2 and SU-3 were also added.

SU-1: Sodium di-2-ethylhexyl sulfosuccinate
SU-2: Sodium di(2,2,3,3,4,4,5,5-octafluoropentyl) sulfosuccinate
SU-3: Sodium tri-i-propylnaphthalenesulfonate
H-1: 2,4-Dichloro-6-hydroxy-s-triazine sodium salt
H-2: Tetrakis(vinylsulfonylmethyl)methane Layer Constitution The addition amount is represented in terms of a coating amount (g/$m^2$) and a coating amount of a silver halide emulsion is represented by equivalent converted to silver.

| 8th Layer (UV absorbing layer) | |
|---|---|
| Gelatin | 1.20 |
| UV absorbent (UV-1) | 0.075 |
| UV absorbent (UV-2) | 0.025 |
| UV absorbent (UV-3) | 0.100 |
| Silica matting agent | 0.01 |
| 7th Layer (Red sensitive layer) | |
| Gelatin | 1.20 |
| Red sensitive emulsion (Em-R1) | 0.35 |
| Cyan coupler (C-1) | 0.40 |
| Antistaining agent (HQ-1) | 0.02 |
| Restrainer (T-1:T-2:T-3 = 1:1:1 in mol) | 0.002 |
| High boiling agent (SO-2) | 0.40 |
| 6th Layer (Interlayer) | |
| Gelatin | 1.00 |
| Antistaining agent (HQ-2, HQ-3; 1:1 by weight) | 0.02 |
| 5th Layer (Green sensitive layer) | |
| Gelatin | 1.60 |
| Green sensitive emulsion (Em-G1) | 0.40 |
| Magenta coupler (M-1) | 0.25 |

-continued

| | |
|---|---|
| Yellow coupler (Y-3) | 0.06 |
| Antistaining agent (HQ-1) | 0.035 |
| Restrainer (T-1:T-2:T-3 = 1:1:1 in mol) | 0.0036 |
| High boiling agent (SO-1) | 0.38 |
| 4th Layer (Interlayer) | |
| | |
| Gelatin | 1.00 |
| Antistaining agent (HQ-2, HQ-3; 1:1 by weight) | 0.02 |
| Antiirradiation dye (AI-1) | 0.035 |
| Antiirradiation dye (AI-2) | 0.035 |
| 3rd Layer (Infrared sensitive layer) | |
| | |
| Gelatin | 1.20 |
| Infrared sensitive emulsion (Em-IFR1) | 0.48 |
| Yellow coupler (Y-1) | 0.20 |
| Yellow coupler (Y-2) | 0.20 |
| Antistaining agent (HQ-1) | 0.04 |
| Restrainer (T-1:T-2:T-3 = 1:1:1 in mol) | 0.0036 |
| High boiling agent (SO-1) | 0.30 |
| 2nd Layer (Interlayer) | |
| | |
| Gelatin | 0.5 |
| Antistaining agent (HQ-2, HQ-3; 1:1 by weight) | 0.02 |
| Antiirradiation dye (AI-3) | 0.15 |
| 1st Layer (Black colloidal silver layer) | |
| | |
| Gelatin | 0.70 |
| Black colloidal silver | 0.10 |

Support
Polyethylene-laminated paper containing a small amount of colorant.
SO-1: Tri(n-octyl)phosphine oxide
SO-2: Di(i-decyl)phthalate
HQ-1: 2,5-Di(t-butyl)hydroquinone
HQ-2: 2,5-Di[(1,1-dimethyl-4-hexyloxycarbonyl)butyl]-hydroquinone
HQ-3: Mixture of 2,5-di-sec-dodecylhydroquinone, 2,5-di-sec-tetradecylhydroquinone and 2-sec-dodecyl-5-sec-tetradecylhydroquinone (wt. ratio 1:1:2)
T-2: 1-(3-Acetoamidophenyl)-5-mercaptotetrazole
T-3: N-Benzyladenine Y-1
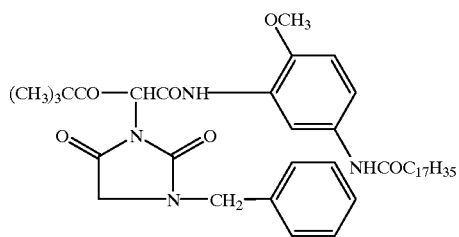

Y-2
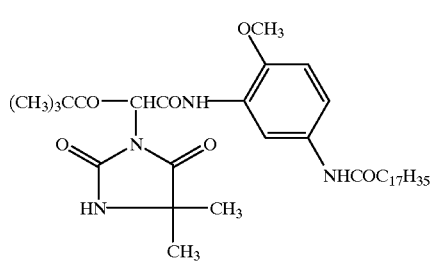

Y-3
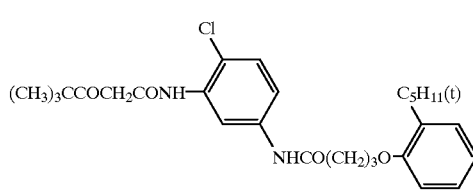

M-1
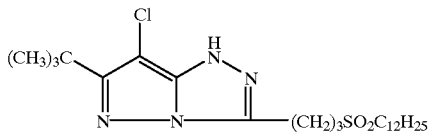

C-1
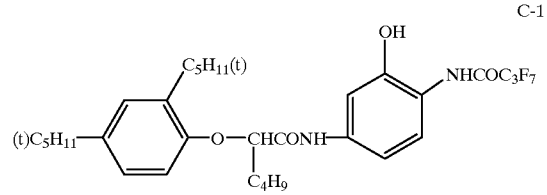

UV-1
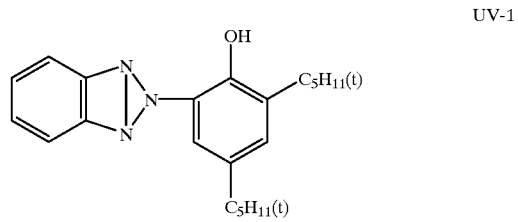

UV-2
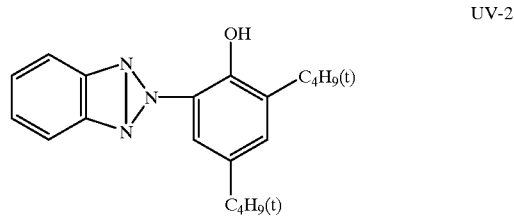

UV-3
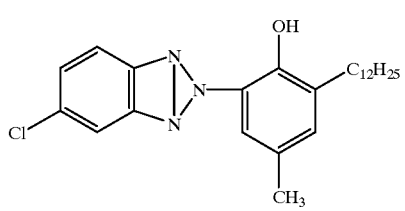

AI-1
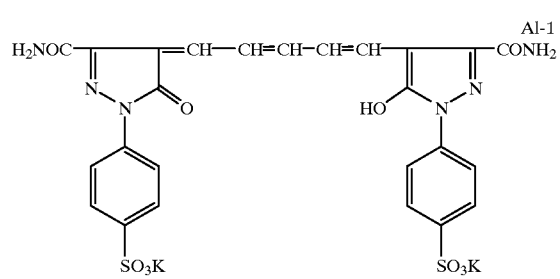

AI-2
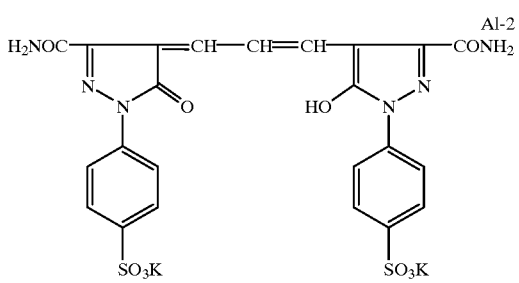

Al-3

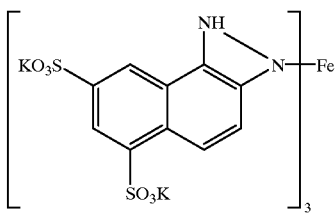

Sample 102 was prepared in a manner similar to Sample 101, provided that 15% of the green sensitive emulsion and 15% of the red sensitive emulsion each were replaced equimolar amount of the panchromatic emulsion described above. Sample 103 was prepared in a manner similar to Sample 101, provided that the red sensitive emulsion was replaced by the following red sensitive emulsion described below. Sample 104 was prepared in a manner similar to Sample 103, provided that 15% of the green sensitive emulsion and 15% of the red sensitive emulsion each were replaced equimolar amount of the panchromatic emulsion.

| 7th Layer (Red sensitive layer) | |
|---|---|
| Gelatin | 1.20 |
| Red sensitive emulsion (Em-R1) | 0.30 |
| Cyan coupler (Exemplified compound I-18) | 0.25 |
| High boiling solvent (SO-3)* | 0.30 |
| High boiling solvent (SO-4)** | 0.30 |
| Antistaining agent (HQ-1) | 0.02 |
| Restrainer (T-1:T-2:T-3 = 1:1:1 in mol) | 0.002 |

*SO-3: Tricresyl phosphate
**SO-4: p-$CH_3$—$C_6H_4$—$SO_2NH$—$C_6H_4$—$C_{12}H_{25}$-p Exposure was made, using as the laser light source, a green helium-neon laser (544 nm), a red semiconductor laser (AlGaInAs: ca. 650 nm), and an infrared semiconductor laser (GaAlAs: ca. 780 nm). To record images, the photographic material was mounted in close contact with the rotating drum by evacuation and subjected to horizontal and vertical exposure at a speed of 2,000 rpm. With respect to the exposure amount, the exposing light output of the green laser light source unit was 1 μW and that of the infrared light source unit was 15 μW, wherein twelve infrared semiconductor lasers were arranged and the photographic material was simultaneously exposed to twelve laser light beams.

After exposure, photographic material samples each were processed according to the following process described above. As to the spectral sensitivity peak of each emulsion layer of the photographic material, the green sensitive emulsion, red sensitive emulsion and infrared sensitive emulsion each had a spectral sensitivity maximum at 548 nm, 675 nm and 785 nm, respectively.

| Process | | |
|---|---|---|
| Processing step | Temperature | Time |
| Immersing in developing solution | 37° C. | 12 seconds |
| Light fogging | — | 12 seconds |
| Developing | 37° C. | 95 seconds |
| Bleach-fixing | 35° C. | 45 seconds |
| Stabilizing | 25–35° C. | 90 seconds |

| -continued | | |
|---|---|---|
| Drying | 50–85° C. | 40 seconds |
| Color developing solution | Developer | Replenisher |
| Benzyl alcohol | 15.0 ml | 18.5 ml |
| Ethyleneglycol | 8.0 ml | 10.0 ml |
| Diethylene glycol | 15.0 ml | 18.0 ml |
| Potassium sulfite | 2.5 g | 2.5 g |
| Potassium bromide | 1.0 g | 0.2 g |
| Potassium carbonate | 25.0 g | 25.0 g |
| T-1 | 0.1 g | 0.1 g |
| Hyroxylamine sulfate | 5.0 g | 5.0 g |
| Sodium diethylenetriamine-pentaacetate | 2.0 g | 2.0 g |
| 4-Amino-N-ethyl-N-(β-hydroxyethyl) aniline sulfate | 4.5 g | 5.4 g |
| Brightener (4,4'-diamino-stilbene-disulfonic acid derivative) | 1.0 g | 1.0 g |
| Potassium hydroxide | 2.0 g | 2.0 g |

Water is added to make 1 lit. and the pH of the developer and replenisher are 10.15 and 10.35, respectively.

| Bleach-fixing solution | |
|---|---|
| Ferric ammonium diethylenetriaminepentaacetate | 90.0 g |
| Ammonium thiosulfate (70% aqueous solution) | 180.0 ml |
| Ammonium sulfite (40% aqueous solution) | 27.5 ml |
| 3-mercapto-1,2,4-triazole | 0.15 g |
| Water to make | 1000 ml. |

The pH was adjusted to 7.1 with potassium carbonate or glacial acetic acid

| Stabilizing solution and replenisher | |
|---|---|
| O-Phenylphenol | 0.1 g |
| 1-Hydroxyethylidene-1,1-diphosphonic acid | 4.0 g |
| Diethylenetriaminepentaacetic acid | 2.0 g |
| Ammonium hydroxide (28% aqueous solution) | 0.7 g |
| Brightener (4,4'-diaminostilbene-disulfonic acid derivative) | 1.0 g |
| Water to make | 1 liter. |

The pH was adjusted to 7.5 with ammonium hydroxide or sulfuric acid. The stabilization treatment was performed using the triple bath counterflow system. The replenishing rate of the developing, bleach-fixing and stabilizing solutions was respectively 320 ml/m².

Using Konsensus 570 available from Konica Corporation, color proofs composed of halftone dot images of Samples 101 to 104 were prepared.

Black reproduction and color reproduction of each sample were evaluated based on color difference between each sample and color samples sold by Japan Color (i.e., distance ΔE on the CIE L*a*b* color space). Measurements were made using color differencemeter CM-2002 (available from MINOLTA Co. Ltd.).

Black reproduction

The color difference of not more than 2.0 was acceptable for practice.

Color reproduction

The color difference was evaluated based on the following criteria:

A: 0≦Color difference≦5,
B: 5<Color reproduction≦7,
C: 7<Color reproduction≦9, and
D: 9<Color reproduction Stability Variation of a monochromatic density was measured by X-rite 408 Densitometer (available from X-rite Corp.) and reproducibility was evaluated based on the following criteria:

A: Absolute value of variation≦0.01
B: 0.01<Absolute value of variation≦0.02
C: 0.02<Absolute value of variation≦0.03
D: 0.03<Absolute value of variation Results thereof are shown in Table 1.

TABLE 1

| Sample No. | Black Em | Black reproduction | Color Reproduction | | | Remark |
|---|---|---|---|---|---|---|
| | | | Y | M | C | |
| 101 (Comp.) | No | Acceptable | C | D | D | D |
| 102 (Inv.) | Yes | Acceptable | B | B | B | B |
| 103 (Comp.) | No | Acceptable | C | D | D | B |
| 104 (Inv.) | Yes | Acceptable | B | B | A | B |

As apparent from Table 1, incorporation of a panchromatic emulsion led to superior results in both black reproduction and color reproduction. Specifically, enhanced effects were achieved by the use of laser light source. Furthermore, the use of the exemplified cyan coupler led to improved results in not only color reproduction but also stability.

What is claimed is:

1. A direct positive silver halide photographic material comprising a support having thereon a yellow image forming unit, a magenta image forming unit and a cyan image forming units, each of the image forming units containing at least an internal latent image-forming silver halide emulsion, wherein one or more of the image forming units contain at least an internal latent image-forming silver halide emulsion having a spectral sensitivity maximum in the wavelength region of from 700 to 850 nm, at least one of the image forming units containing at least two internal latent image forming silver halide emulsions 1 and 2, said emulsion 1 having a lower factor of contribution to image formation than said emulsion 2, and said emulsion 1 having a spectral sensitivity with a part common to a spectral sensitivity of a silver halide emulsion contained in one of the other two image forming units; said photographic material further being subjected to exposure, based on digitized image information.

2. The photographic material of claim 1, wherein said emulsion 1 has a spectral with a part common to a spectral sensitivity of said emulsion 2.

3. The photographic material of claim 1, wherein said emulsion 1 is contained in an amount of not more than 25 mol %, based on silver.

4. The photographic material of claim 1, wherein one of the image forming units contains at least two internal latent image forming silver halide emulsions 1 and 2, said emulsion 1 having a lower factor of contribution to image formation than said emulsion 2 and having a spectral sensitivity with a part common to a spectral sensitivity of said emulsion 2; one of the other two image forming units containing at least two internal latent image forming silver halide emulsions 1' and 2', said emulsion 1' having a lower factor of contribution to image formation than said emulsion 2' and having a spectral sensitivity with a part common to a spectral sensitivity of said emulsion 2'; and said emulsions 1 further having a spectral sensitivity with a part common to the spectral sensitivity of emulsion 2' and said emulsions 1' further having a spectral sensitivity with a part common to the spectral sensitivity of emulsion 2.

5. The photographic material of claim 4, wherein said emulsion 1 has the same spectral sensitivity as said emulsion 1'.

6. The photographic material of claim 4, wherein said emulsion 1' is contained in an amount of not more than 25 mol %, based on silver.

7. The photographic material of claim 4, wherein the magenta image forming unit contains said emulsions 1 and 2, and the cyan image forming unit containing said emulsions 1' and 2'.

8. The photographic material of claim 1, wherein said cyan image forming unit contains a cyan dye-forming coupler represented by the following formula (I) or (II):

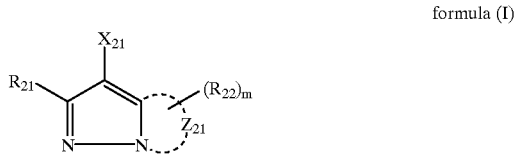

formula (I)

wherein
$R_{21}$ is a hydrogen atom or a substituent;
$R_{22}$ is a substituent;
m is an integer of 0, 1 or 2, provided that when m is 0, $R_{21}$ is an electron-withdrawing group and when m is 1 or 2, at least one of $R_{21}$ and $R_{22}$ is an electron-withdrawing group;
$Z_{21}$ is a non-metallic atom group necessary to form a nitrogen containing 5-membered heterocyclic ring; and
$X_{21}$ is a hydrogen atom or a group capable of being released upon reaction with an oxidation product of a color developing agent;

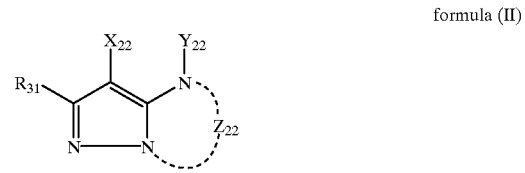

formula (II)

wherein
$R_{31}$ and $Y_{22}$ each are a hydrogen atom or a substituent;
$X_{22}$ is a hydrogen atom or a group capable of being released upon reaction with an oxidation product of a color developing agent;
$Z_{22}$ is a nonmetallic atom group necessary to form a nitrogen containing 6-membered heterocyclic ring.

9. An image forming method of a silver halide photographic material comprising:
subjecting the photographic material to exposure, based on digitized image information,
wherein said photographic material is a direct positive silver halide photographic material comprising a support having thereon a yellow image forming unit, a magenta image forming unit and a cyan image forming units, each of the image forming units containing at least an internal latent image-forming silver halide emulsion, wherein one or more of the image forming units contain at least an internal latent image-forming silver halide emulsion having a spectral sensitivity maximum in the wavelength region of from 700 to 850 nm, at least one of the image forming units containing at least two internal latent image forming silver halide emulsions 1 and 2, said emulsion 1 having a lower factor of contribution to image formation than said emulsion 2, and said emulsion 1 having a spectral sensitivity with a part common to a spectral sensitivity of a silver halide emulsion contained in one of the other two image forming units.

10. The image forming method of claim 9, wherein a semiconductor laser or a light emission diode is used as a light source.

* * * * *